(12) United States Patent
Naono

(10) Patent No.: US 12,019,235 B2
(45) Date of Patent: Jun. 25, 2024

(54) MICROMIRROR DEVICE AND METHOD OF DRIVING MICROMIRROR DEVICE

(71) Applicant: FUJIFILM Corporation, Tokyo (JP)

(72) Inventor: Takayuki Naono, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 602 days.

(21) Appl. No.: 17/222,316

(22) Filed: Apr. 5, 2021

(65) Prior Publication Data

US 2021/0223539 A1 Jul. 22, 2021

Related U.S. Application Data

(63) Continuation of application No. PCT/JP2019/039481, filed on Oct. 7, 2019.

(30) Foreign Application Priority Data

Oct. 25, 2018 (JP) .................................. 2018-201070

(51) Int. Cl.
*G02B 26/08* (2006.01)
*G02B 26/10* (2006.01)

(52) U.S. Cl.
CPC ....... *G02B 26/0858* (2013.01); *G02B 26/101* (2013.01)

(58) Field of Classification Search
CPC .................. G02B 26/0858; G02B 26/101
(Continued)

(56) References Cited

U.S. PATENT DOCUMENTS 6,262,827 B1 * 7/2001 Ueda .................. G02B 26/0841
359/223.1
9,753,280 B2 * 9/2017 Hofmann .............. B81B 3/0043
(Continued)

FOREIGN PATENT DOCUMENTS

CN 102474204 A 5/2012
CN 107797274 A 3/2018
(Continued)

OTHER PUBLICATIONS

Japanese Office Action for corresponding Japanese Application No. 2020-553080, dated May 24, 2022, with English translation.
(Continued)

*Primary Examiner* — Collin X Beatty
(74) *Attorney, Agent, or Firm* — Birch, Stewart, Kolasch & Birch, LLP

(57) ABSTRACT

A micromirror device includes: a mirror portion that has a reflective surface reflecting incident light; a first actuator that has an annular shape and is disposed around the mirror portion; a second actuator that has an annular shape and is disposed around the first actuator; a first connection portion that connects the mirror portion and the first actuator on a first axis, which is in a plane including the reflective surface of the mirror portion in a stationary state, and that rotatably supports the mirror portion around the first axis; a second connection portion that connects the first actuator and the second actuator on a second axis, which is in a plane including the reflective surface of the mirror portion in a stationary state and is orthogonal to the first axis, and that rotatably supports the first actuator around the second axis; a third connection portion that is connected to an outer circumference of the second actuator on the second axis; and a fixed portion that is connected to the third connection
(Continued)

portion, and supports the second actuator through the third connection portion.

20 Claims, 23 Drawing Sheets

(58) Field of Classification Search
USPC .......................................................... 359/290
See application file for complete search history.

(56) References Cited

U.S. PATENT DOCUMENTS

| | | | |
|---|---|---|---|
| 9,893,263 B2* | 2/2018 | Aimono | G09G 3/025 |
| 2007/0268544 A1 | 11/2007 | Ueyama | |
| 2008/0239252 A1 | 10/2008 | Konno et al. | |
| 2009/0284818 A1 | 11/2009 | Maekawa | |
| 2011/0181933 A1 | 7/2011 | Kubo et al. | |
| 2015/0277107 A1 | 10/2015 | Aimono | |
| 2018/0067304 A1 | 3/2018 | Hattass et al. | |

FOREIGN PATENT DOCUMENTS

| | | | | |
|---|---|---|---|---|
| EP | 2962984 A1 * | 1/2016 | | G02B 26/0858 |
| EP | 3 012 679 A1 | 4/2016 | | |
| EP | 3 203 297 A1 | 8/2017 | | |
| EP | 3 950 572 A1 | 2/2022 | | |
| JP | 2008-20701 A | 1/2008 | | |
| JP | 2009-15300 A | 1/2009 | | |
| JP | 4984117 B2 | 7/2012 | | |
| JP | 5151065 B2 | 2/2013 | | |
| JP | 2014-186244 A | 10/2014 | | |
| JP | 2016-85299 A | 5/2016 | | |
| JP | 2018-41085 A | 3/2018 | | |
| JP | 2018-155784 A | 10/2018 | | |

OTHER PUBLICATIONS

Chinese Office Action and Search Report for corresponding Chinese Application No. 201980069459.8, dated Jun. 29, 2022, with English translation.

International Preliminary Report on Patentability and Written Opinion of the International Searching Authority, with an English translation, dated May 6, 2021, for International Application No. PCT/JP2019/039481.

International Search Report, dated Nov. 26, 2019, for International Application No. PCT/JP2019/039481, with an English translation.

Extended European Search Report for European Application No. 19876962.2, dated Nov. 8, 2021.

Cowen et al., "SOIMUMPs Design Handbook," MEMSCAP Inc., Jan. 1, 2002, pp. 1-26, XP093038389, retrieved from the internet: http://www.memscapinc.com/_data/assets/ pdf_file/0019/1774/ SOIMUMPs.dr.v8.0.pdf.

European Communication pursuant to Article 94(3) EPC for corresponding European Application No. 19876962.2, dated Apr. 20, 2023.

* cited by examiner

FIG. 19
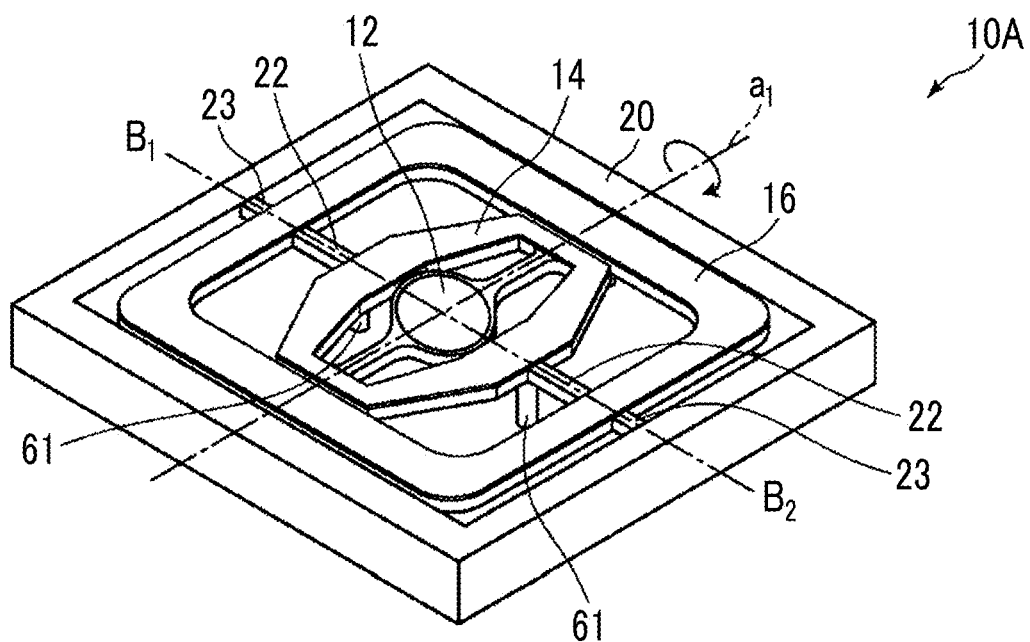
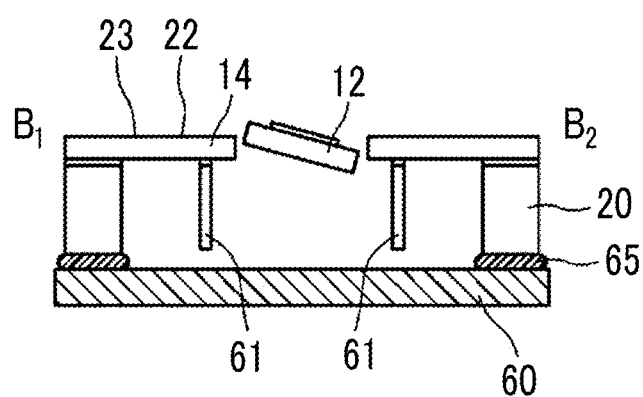

FIG. 22
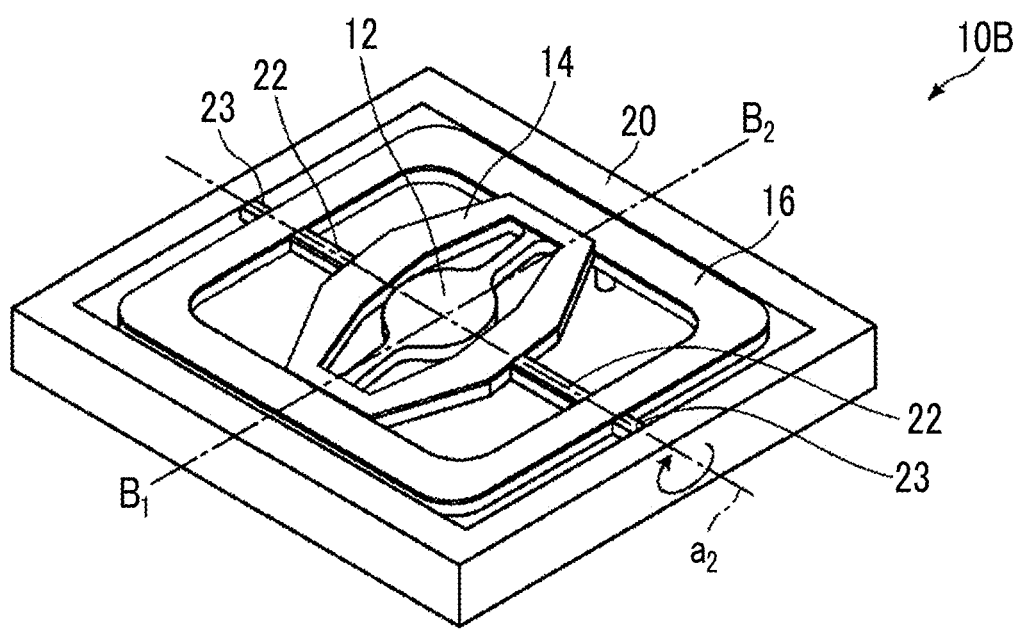
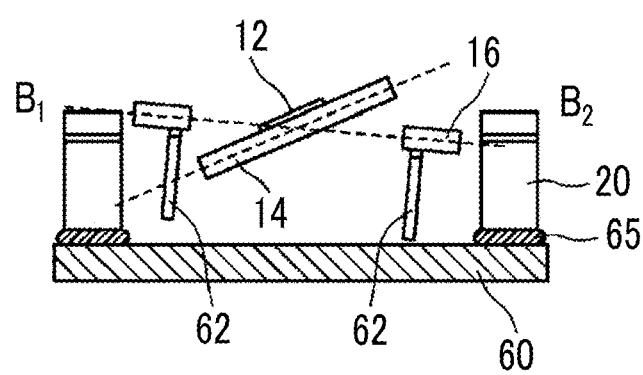

MICROMIRROR DEVICE AND METHOD OF DRIVING MICROMIRROR DEVICE

CROSS-REFERENCE TO RELATED APPLICATIONS

This application is a Continuation of PCT International Application No. PCT/JP2019/039481 filed on Oct. 7, 2019, which claims priority under 35 U.S.C § 119(a) to Japanese Patent Application No. 2018-201070 filed on Oct. 25, 2018. Each of the above application(s) is hereby expressly incorporated by reference, in its entirety, into the present application.

BACKGROUND OF THE INVENTION

1. Field of the Invention

The present invention relates to a micromirror device and a method of driving the micromirror device.

2. Description of the Related Art

A micromirror device (also referred to as a micro-scanner) is known as one of the micro electro mechanical systems (MEMS) devices manufactured by using the microfabrication technology of silicon (Si). A micromirror device is an optical scanner that drives a micromirror to perform two-dimensional scanning of light. Since this micromirror device is small and has low consumed power, it is expected that the micromirror device is applied to head-up displays, retinal displays, and the like using lasers.

As an optical scanning method for displaying images, attention has been focused on a Lissajous scanning method of covering the screen by driving sinusoidally on both the horizontal and vertical axes and drawing a Lissajous waveform, as compared with the raster scanning method that has been common until now. According to the Lissajous scanning method, the algorithm of the laser driver is complicated. However, the mirror can be miniaturized, and a wide angle of view can be realized while suppressing the driving consumed power.

There are various driving methods for micromirrors, but among them, the piezoelectric driving method using deformation of a piezoelectric body is promising since the method generates a higher torque than other methods and is capable of obtaining a high scan angle. For example, JP5151065B, JP4984117B, and JP2018-041085A each propose a piezoelectric driving type optical scanner as a micromirror device.

JP5151065B discloses an optical scanner having a configuration in which a mirror portion is connected to a movable frame through a torsion bar and the movable frame is connected to a fixed portion through a piezoelectric actuator. A two-dimensional scanning operation of light is realized by oscillating the mirror portion together with the movable frame around two axes using the piezoelectric actuator.

JP4984117B discloses an optical scanner comprising: a first connection portion that includes a mirror portion, an internal movable frame provided so as to surround the mirror portion, a support provided so as to surround the internal movable frame, a first torsion bar, and a first piezoelectric diaphragm, and that connects the mirror portion and the internal movable frame; and a second connection portion that includes a second torsion bar and a second piezoelectric diaphragm and that connects the internal movable frame and the support. A two-dimensional light scanning operation is realized by causing piezoelectric actuators to apply torque around the first axis and the second axis to the first connection portion and the second connection portion, respectively.

In JP2018-041085A, the mirror portion is connected to the first frame device (movable frame) that surrounds the mirror portion through the first torsion bar, and the first frame device is connected to an actuator structure that surrounds the first frame device through the second torsion bar. Further, disclosed is a configuration in which the actuator structure is connected to a second frame device that surrounds the actuator through a third torsion bar. The actuator structure is provided with four actuator devices symmetrical to the first axis and the second axis, and the mirror portion is rotated around the two axes by driving the four actuator devices. Thereby, a two-dimensional light scanning operation is realized.

SUMMARY OF THE INVENTION

Each of the optical scanners of JP5151065B, JP4984117B, and JP2018-041085A has a movable frame connected to a mirror portion. By providing this movable frame, the effect of oscillation insulation can be obtained so that the oscillation energy inside the movable frame does not leak to the outside or the oscillation energy from the outside does not leak to the inside. That is, by providing the movable frame, there is an advantage that a crosstalk between the two axes at the time of scanning can be reduced. However, since the movable frame itself is unable to generate a driving force, the piezoelectric actuator connected to the outside is responsible for driving all the axes, which causes a problem of poor energy efficiency. As a result, the advantage of low consumed power in a case where the piezoelectric actuator is used is not sufficiently effective.

The present disclosure has been made in view of the above circumstances, and an object of the present disclosure is to provide a micromirror device and a method of driving a micromirror device using a piezoelectric driving method capable of further reducing consumed power.

Specific means for solving the above problems include the following aspects.

<1> A micromirror device comprising:
a mirror portion that has a reflective surface reflecting incident light;
a first actuator that has an annular shape and is disposed around the mirror portion;
a second actuator that has an annular shape and is disposed around the first actuator;
a first connection portion that connects the mirror portion and the first actuator on a first axis, which is in a plane including the reflective surface of the mirror portion in a stationary state, and that rotatably supports the mirror portion around the first axis;
a second connection portion that connects the first actuator and the second actuator on a second axis, which is in a plane including the reflective surface of the mirror portion in a stationary state and is orthogonal to the first axis, and that rotatably supports the first actuator around the second axis;
a third connection portion that is connected to an outer circumference of the second actuator on the second axis; and
a fixed portion that is connected to the third connection portion, and supports the second actuator through the third connection portion, in which the first actuator and the second actuator are piezoelectric actuators each including a piezoelectric element, and the first actuator and the second actuator apply a rotational torque around the first axis to the mirror portion and apply a rotational torque around the second axis to the mirror portion and the first actuator so as to two-dimensionally rotationally drive the mirror portion around the first axis and the second axis.

<2> The micromirror device according to <1>, in which the first actuator includes a pair of first movable portions having semi-annular shapes, the second actuator includes a pair of second movable portions having semi-annular shapes, the first connection portion connects the mirror portion and one end of each of the pair of first movable portions, and connects the mirror portion and the other end of each of the pair of first movable portions, on the first axis, and the second connection portion connects one of the pair of first movable portions and one end of each of the pair of second movable portions, and connects the other of the pair of first movable portions and the other end of each of the pair of second movable portions, on the second axis.

<3> The micromirror device according to <1> or <2>, in which in a case where the micromirror device is driven in a lowest order mode of resonance modes in which the mirror portion tilts and oscillates around the first axis, and the mirror portion and the first actuator tilt and oscillate in opposite phases to each other, a ratio $R1=|Zm/Lm|/|Za_{11}/La_{11}|$ of an amount of displacement tilt $|Zm/Lm|$ of the mirror portion and an amount of displacement tilt $|Za_{11}/La_{11}|$ of the first actuator is $9.4<R1<87$.

<4> The micromirror device according to <3>, in which the ratio R1 is $16 \leq R1$.

<5> The micromirror device according to any one of <1> to <4>, in which in a case case where the micromirror device is driven in a lowest order mode of resonance modes in which the mirror portion and the first actuator tilt and oscillate around the second axis, and the mirror portion, the first actuator, and the second actuator tilt and oscillate in opposite phases to each other, a ratio $R2=|Za_{12}/La_{12}|/|Za_{22}/La_{22}|$ of an amount of displacement tilt $|Za_{12}/La_{12}|$ of the first actuator and an amount of displacement tilt $|Za_{22}/La_{22}|$ of the second actuator is $0.75<R2<27$.

<6> The micromirror device according to <5>, in which the ratio R2 is $2.3<R2$.

<7> The micromirror device according to any one of <1> to <6>, in which the fixed portion has a thickness larger than those of the mirror portion, the first actuator, and the second actuator.

<8> The micromirror device according to <7>, in which the first actuator includes a first stopper portion consisting of a structure having the same thickness as the fixed portion.

<9> The micromirror device according to <7> or <8>, in which the second actuator includes a second stopper portion consisting of a structure having the same thickness as the fixed portion.

<10> The micromirror device according to any one of <1> to <9>, further comprising a driving circuit that inputs driving signals to piezoelectric elements of the first actuator and the second actuator.

<11> The micromirror device according to <10>, in which the driving circuit inputs, to the piezoelectric elements, driving signals for driving the micromirror device in a first resonance mode in which the mirror portion tilts and oscillates around the first axis and for driving the micromirror device in a second resonance mode in which the mirror portion and the first actuator tilt and oscillate around the second axis.

<12> The micromirror device according to <11>, in which the first resonance mode is a lowest order mode of resonance modes in which the mirror portion and the first actuator tilt and oscillate in opposite phases to each other.

<13> The micromirror device according to <11> or <12>, in which the second resonance mode is a lowest order mode of resonance modes in which the mirror portion, the first actuator, and the second actuator tilt and oscillate in opposite phases to each other.

<14> A method of driving the micromirror device according to any one of <1> to <10>, the method comprising: exciting a first resonance mode, in which the mirror portion tilts and oscillates around the first axis, by inputting a driving signal waveform with a first frequency to the piezoelectric element of the first actuator; and exciting a second resonance mode, in which the mirror portion and the first actuator tilt and oscillate around the second axis, by inputting a driving signal waveform with a second frequency to the piezoelectric element of the second actuator.

<15> The method of driving the micromirror device according to <14>, in which the first actuator excites, as the first resonance mode, a lowest order mode of the resonance modes in which the mirror portion and the first actuator tilt and oscillate in opposite phases to each other.

<16> The method of driving the micromirror device according to <14> or <15>, in which the second actuator excites, as the second resonance mode, a lowest order mode of the resonance modes in which the first actuator, the mirror portion, and the second actuator tilt and oscillate in opposite phases to each other.

According to the present disclosure, it is possible to provide a micromirror device and a method of driving a micromirror device using a piezoelectric driving method capable of realizing lower consumed power than before.

BRIEF DESCRIPTION OF THE DRAWINGS

FIG. 19 is a perspective view showing a tilted state of the micromirror device of FIG. 18 in a case of driving in a first resonance mode, and a cross-sectional view taken along the line $B_1$-$B_2$.

FIG. 22 is a perspective view showing a tilted state in a case of driving in a second resonance mode of the micromirror device of FIG. 21 and a cross-sectional view taken along the line $B_1$-$B_2$.

DESCRIPTION OF THE PREFERRED EMBODIMENTS

Hereinafter, specific embodiments of the present invention will be described with reference to the drawings.

Figure 1:
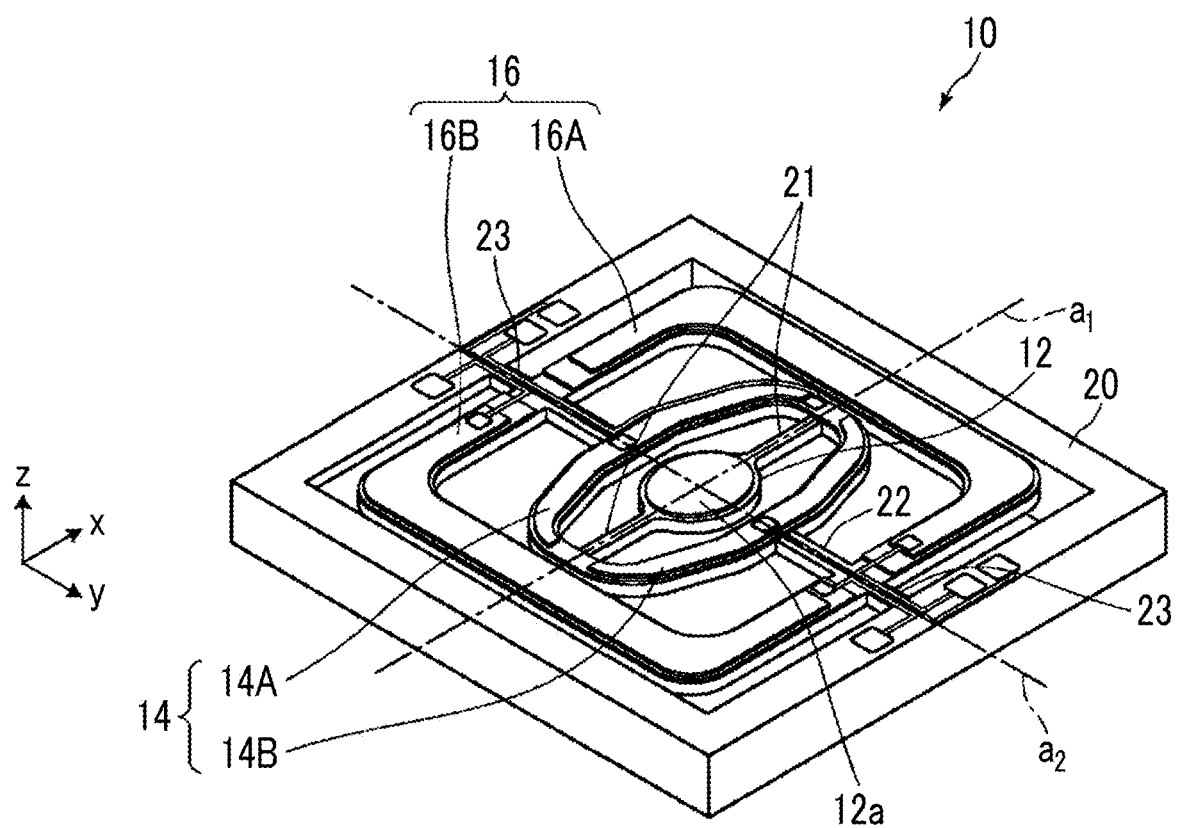
FIG. 1 is a perspective view of the micromirror device according to a first embodiment.
Figure 2:
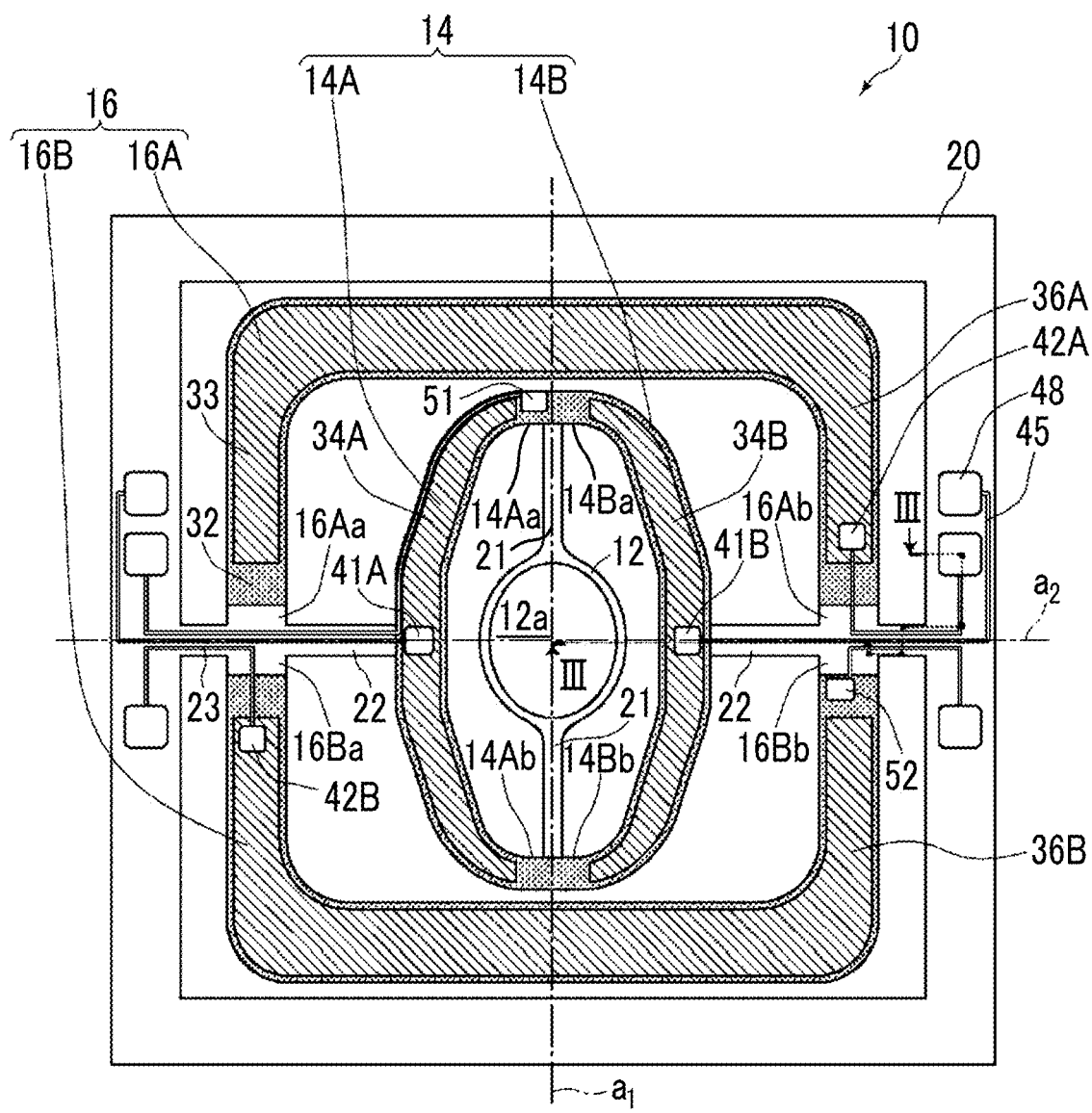
FIG. 2 is a plan view (top view) of a mirror portion as viewed from a reflective surface side.
Figure 3:
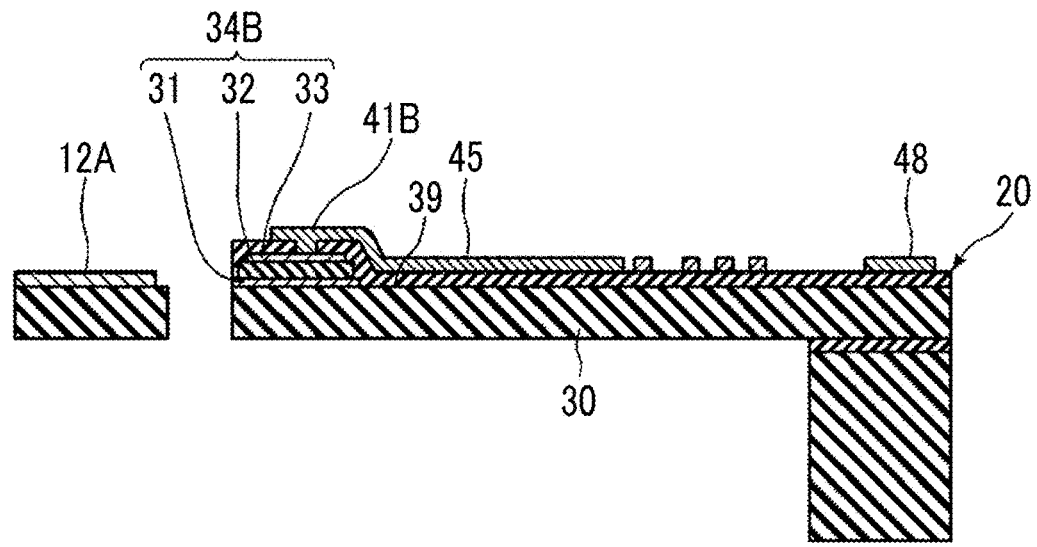
FIG. 3 is a cross-sectional view taken along the line III-III of FIG. 2.

FIG. 1 is a perspective view of the micromirror device according to the embodiment, and FIG. 2 is a plan view (top view) of the mirror portion as viewed from the reflective surface side. Further, FIG. 3 is a cross-sectional view taken along the line III-III of FIG. 2. As shown in FIGS. 1 and 2, the micromirror device 10 of the present embodiment includes a mirror portion 12, a first actuator 14, a second actuator 16, a fixed portion 20, a first connection portion 21, a second connection unit 22, and a third connection portion unit 23. The size of the micromirror device is generally, for example, about 1 mm to 10 mm in length and width, but may be smaller or larger than the above size, and is not particularly limited. Further, the thickness of the movable portion (each movable portion 14A, 14B, 16A, 16B described later) is generally about 5 m to 0.2 mm, but may be within a range in which the movable portion can be manufactured, and is not particularly limited.

The mirror portion 12 has a reflective surface 12a that reflects incident light. The reflective surface 12a is composed of a metal thin film such as Au (gold) and Al (aluminum) provided on one surface of the mirror portion 12. The material and film thickness used for the mirror coating for forming the reflective surface 12a are not particularly limited, and various designs can be made using a known mirror material (high reflectance material).

FIGS. 1 and 2 exemplify a mirror portion 12 having an elliptical reflective surface 12a and having a plan view shape similar to the reflective surface 12a. However, the plan view shape of the mirror portion 12 and the shape of the reflective surface 12a may be the same or different. The shapes of the mirror portion 12 and the reflective surface 12a are not particularly limited. Not limited to the elliptical shape exemplified, there may be various shapes such as a circle, a square, a rectangle, and a polygon.

The first actuator 14 is an annular member disposed so as to surround the mirror portion 12, and the second actuator 16 is an annular member disposed so as to surround the first actuator. In the present specification, the annular shape may be any shape that surrounds the inner region without interruption, and the inner and outer circumferences may not be circular, and may be any shape such as a rectangular shape or a polygonal shape.

The first connection portion 21 connects the mirror portion 12 and the first actuator 14 on a first axis $a_1$, which is in a plane including the reflective surface 12a of the mirror portion 12 in a stationary state, and rotatably supports the mirror portion 12 around the first axis $a_1$.

The second connection portion 22 connects the first actuator 14 and the second actuator 16 to a second axis $a_2$, which is in a plane including the reflective surface 12a of the mirror portion 12 in a stationary state and is orthogonal to the first axis $a_1$, and rotatably supports the first actuator 14 around the second axis aa.

The third connection portion 23 connects the second actuator 16 and the fixed portion 20 on the second axis $a_2$.

The fixed portion 20 supports the second actuator 16 through the third connection portion 23.

The first actuator 14 and the second actuator 16 are piezoelectric actuators each including a piezoelectric element. The first actuator 14 and the second actuator 16 apply a rotational torque to the mirror portion 12 around the first axis $a_1$ and apply a rotational torque to the mirror portion 12 and the first actuator 14 around the second axis $a_2$. As a result, the mirror portion 12 is driven to rotate two-dimensionally around the first axis $a_1$ and the second axis $a_2$. The driving force for applying the rotational torque around the first axis $a_1$ to the mirror portion 12 may be generated only by the first actuator 14, or may be generated by both the first actuator 14 and the second actuator 16. Further, the driving force for applying the rotational torque around the second axis $a_2$ to the mirror portion 12 and the first actuator 14 may be generated only by the second actuator 16, or may be generated by both of the first actuator 14 and the second actuator 16.

By driving the mirror portion 12 in two-dimensional rotation, the micromirror device 10 reflects the incident light on the reflective surface 12a of the mirror portion 12. Thereby, it is possible to perform two-dimensional scanning.

In the following, for convenience of explanation, the normal direction of the reflective surface 12a in a case where the mirror portion 12 is stationary is the z-axis direction, the direction parallel to the first axis $a_1$ is the x-axis direction, and the direction parallel to the second axis $a_2$ is the y-axis direction.

The first actuator 14 is an annular thin plate member that surrounds the mirror portion 12 in the xy plane. In the present example, the first actuator 14 includes a pair of first movable portions 14A and 14B having semi-annular shapes. Further, in the present example, the first connection portion 21 connects the mirror portion 12 and one end 14Aa and 14Ba of each of the pair of the first movable portions 14A and 14B, and connects the mirror portion 12 and the other end 14Ab and 14Bb of each of the pair of the first movable portions 14A and 14B, on the first axis $a_1$. That is, the pair of first movable portions 14A and 14B are connected on the first axis $a_1$ and are disposed so as to form an annular shape as a whole.

The second actuator 16 is an annular thin plate member that surrounds the first actuator 14 in the xy plane. In the present example, the second actuator 16 includes a pair of second movable portions 16A and 16B having semi-annular shapes. Further, in the present example, the second connection portion 22 connects one (here, the first movable portion 14A) of the pair of first movable portions 14A and 14B and one end 16Aa and 16Ba of each of the pair of second movable portions 16A and 16B, and connects the other (here, the first movable portion 14B) of the pair of first movable portions 14A and 14B and the other end 16Ab and 16Bb of each of the pair of second movable portions 16A and 16B, on the second axis $a_2$. That is, the pair of second movable portions 16A and 16B are connected on the second axis $a_2$ and are disposed so as to form an annular shape as a whole.

In the first actuator 14, the pair of first movable portions 14A and 14B are provided with piezoelectric elements 34A and 34B, respectively. Further, in the second actuator 16, the pair of second movable portions 16A and 16B are provided with piezoelectric elements 36A and 36B, respectively.

The piezoelectric elements 34A, 34B, 36A, and 36B each have a laminated structure in which the lower electrode 31, the piezoelectric film 32, and the upper electrode 33 are laminated in this order on the movable portion substrate 30 (refer to FIG. 3). In FIG. 2, the dot hatched portion shows the piezoelectric film 32, the shaded hatched portion shows the upper electrode 33, and the insulation film 39 (refer to FIG. 3) provided on the upper electrode 33 is omitted. Electrode pads 41A, 41B, 42A, and 42B, which are connected to the upper electrode 33 by providing an opening in a part of the insulation film 39, are provided. A voltage is applied to the piezoelectric elements 34A, 34B, 36A, and 36B through the wiring 45, which is connected to these electrode pads 41A, 41B, 42A, and 42B, and the electrode pad 48 for connecting the driving circuit provided in the fixed portion 20. Further, like the upper electrode 33, the lower electrode 31 of each piezoelectric element is also pulled out to the fixed portion 20 by an electrode pad and wiring which are not shown and connected to a reference potential (generally a ground potential) of the driving circuit. The first actuator 14 and the second actuator 16 causes the driving force by bending and displacing the movable portions 14A, 14B, 16A, and 16B through the deformation of the piezoelectric film due to the application of a predetermined voltage to the piezoelectric elements 34A, 34B, 36A, and 36B.

The piezoelectric elements 34A, 34B, 36A, and 36B may be provided over substantially the entire surface of each of the movable portions 14A, 14B, 16A, and 16B, or may be provided only in a part thereof. Further, a plurality of piezoelectric elements may be provided in one movable portion. For example, a plurality of piezoelectric elements can be formed by sequentially laminating the lower electrode 31 and the piezoelectric film 32 on substantially the entire surface of the movable portion substrate 30 and separating the upper electrode 33 into a plurality of regions. The shape and number of piezoelectric elements are not limited as long as the desired resonance mode described later can be excited.

The first connection portion 21 extends toward the outside of the mirror portion 12 on both sides in the direction of the first axis $a_1$ and connects the mirror portion 12 and the first actuator 14. The second connection portion 22 extends toward the outside of the first actuator 14 on both sides in the direction of the second axis $a_2$ and connects the first actuator 14 and the second actuator 16. The third connection portion 23 extends toward the outside of the second actuator 16 on both sides in the direction of the second axis $a_2$ and connects the second actuator 16 and the fixed portion 20. That is, the third connection portion 23 and the second connection portion 22 are provided on the same axis. Here, the first axis $a_1$ and the second axis $a_2$ intersect at substantially the center of the mirror portion 12.

Since the second connection portion 22 and the third connection portion 23 are provided on the same axis, non-linearity at the time of resonance can be suppressed. Since the non-linearity at the time of resonance can be suppressed, the control of two-dimensional optical scanning becomes easy, and the angle of view (scan angle) of scanning can be sufficiently increased. As the scan angle, for example, a horizontal axis of 400 or more and a vertical axis of 30° or more are desired.

In the present example, the fixed portion 20 is a frame member that surrounds the second actuator 16. The fixed portion 20 supports the second actuator 16 through the third connection portion 23. The second actuator 16 supports the first actuator 14 through the second connection portion 22. Further, the first actuator 14 supports the mirror portion 12 through the first connection portion 21. Therefore, the fixed portion 20 functions as a member for supporting the first actuator 14 and the mirror portion 12 through the second actuator 16. The fixed portion 20 may be provided with wiring or an electronic circuit other than the wiring and the electrode pad shown in the drawing.

The fixed portion 20 is not limited to the frame member as long as the second actuator 16 can be supported through the third connection portion 23. The fixed portion 20 may be composed of two members of a first fixed portion, which is connected to one of the third connection portions 23, and a second fixed portion which is connected to the other thereof.

In the micromirror device 10 of the present example, the mirror portion 12, the first actuator 14, the second actuator 16, the fixed portion 20, and the first to third connection portions 21 to 23 are disposed to have a line-symmetrical structure in the first axis $a_1$ and the second axis $a_2$. With such a symmetrical structure, rotational torque can be efficiently applied to the central mirror portion 12.

The micromirror device 10 can be manufactured as a structure, in which elements such as the mirror portion 12, the first actuator 14, the second actuator 16, the fixed portion 20, and the first to third connection portions 21 to 23 are integrally formed, for example, by being processed from a silicon substrate through a semiconductor manufacturing technology.

The thicknesses of the mirror portion 12, the first actuator 14, the second actuator 16, and the first to third connection portions 21 to 23 are formed to be less than the thickness (thickness in the z direction) of the fixed portion 20. As a result, the first actuator 14, the second actuator 16, and the first to third connection portions 21 to 23 each have a structure which tends to cause deformation (bending deformation or twisting deformation).

In the micromirror device 10, it is preferable that the first actuator 14 and the second actuator 16 perform driving in a resonance mode in which the mirror portion 12 tilts and oscillates around the first axis $a_1$, and perform driving in a resonance mode in which the mirror portion 12 and the first actuator 14 tilts and oscillates around the second axis $a_2$.

Since the micromirror device of the present disclosure has a structure that does not have a movable frame that leads to an increase in mass, the moment of inertia in the rotation in the second axis can be reduced and the resonance frequency can be increased. For example, a driving frequency of 40 kHz or more on the horizontal axis and 10 kHz or more on the vertical axis can be realized. Therefore, high speed driving can be performed on both the first axis and the second axis. That is, the high speed driving is suitable for Lissajous scanning in which driving in a sinusoidal manner on both the horizontal axis and the vertical axis is performed. Further, both the first and second actuators are piezoelectric actuators in which a piezoelectric film is provided on the movable portion and do not require an external driving mechanism. Therefore, the volume of the element can be reduced to a small size. Since a piezoelectric film is not provided and a movable frame that does not contribute to driving is not provided, driving efficiency is high. As a result, consumed power can be reduced.

The resonance mode in the micromirror device 10 will be described. As the resonance mode, there is not only a mode accompanied by rotation (tilt oscillation) of the mirror portion 12 around the axis, but also a mode accompanied by a piston motion in the vertical direction, a twisting motion in a plane, or the like. In the micromirror device 10 of the present embodiment, the mirror portion 12 is driven by using a resonance mode accompanied by tilt oscillation. The resonance mode around the first axis $a_1$ and the resonance mode around the second axis $a_2$ will be described below in order.

First, the resonance mode accompanied by the tilt oscillation of the mirror portion 12 around the first axis $a_1$ will be described.

Figure 4:
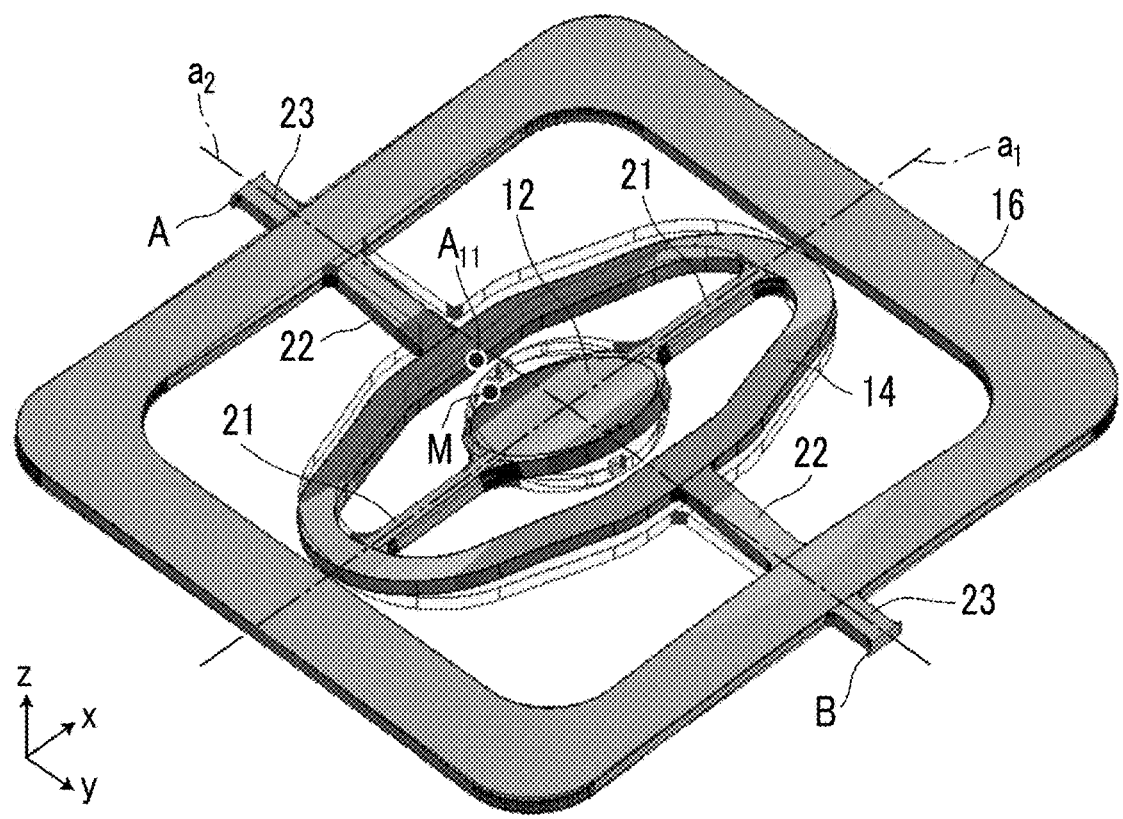
FIG. 4 is a diagram schematically showing a shape displacement of the micromirror device in a resonance mode accompanied by tilt oscillation of the mirror portion around a first axis.

FIG. 4 is a diagram schematically showing the shape displacement of the micromirror device 10 in the lowest order mode of the resonance modes accompanied by the tilt oscillation of the mirror portion 12 around the first axis $a_1$.

Figure 5:
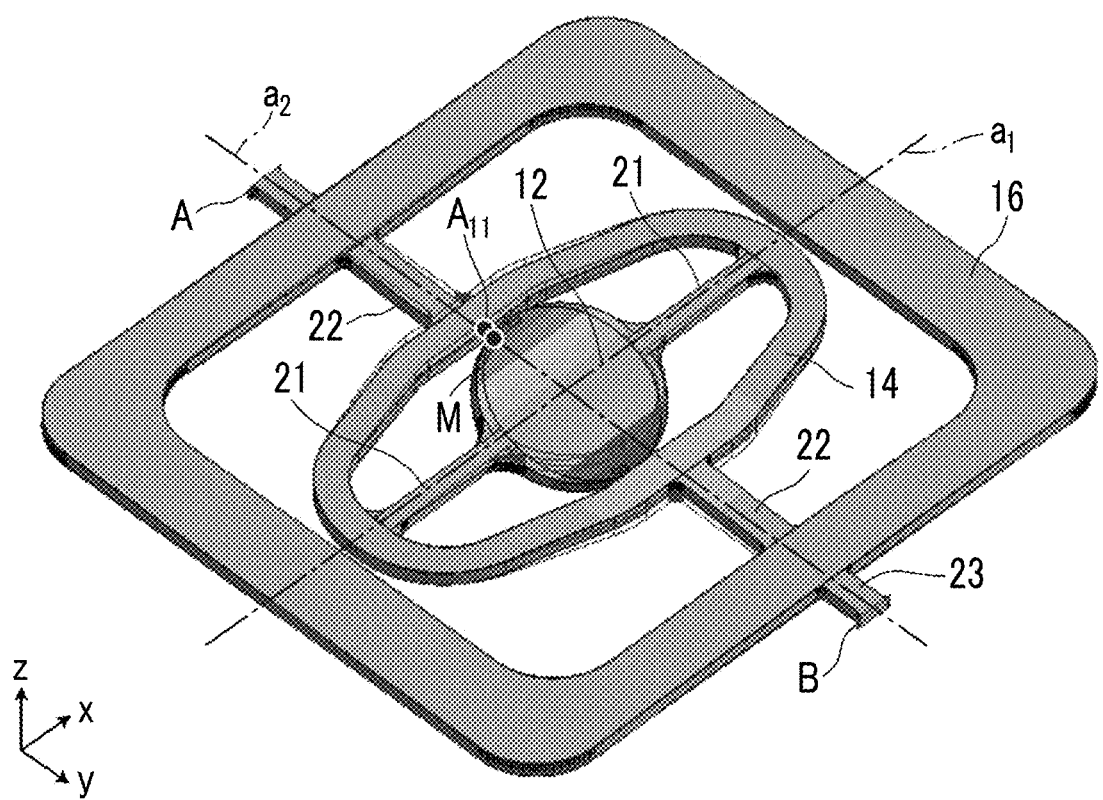
FIG. 5 is a diagram schematically showing a shape displacement of the micromirror device in the resonance mode accompanied by tilt oscillation of the mirror portion around the first axis.

Further, FIG. 5 is a diagram schematically showing the shape displacement of the micromirror device 10 in the second-order mode next to the mode shown in FIG. 4 among the resonance modes accompanied by the tilt oscillation of the mirror portion 12 around the first axis $a_1$. In FIGS. 4 and 5, the fixed portion 20 is omitted. In addition, the position in a stationary state (in the non-driving state) is indicated by a thin line, and the darker the color in the figure, the larger the amount of displacement from the stationary state.

Figure 6:
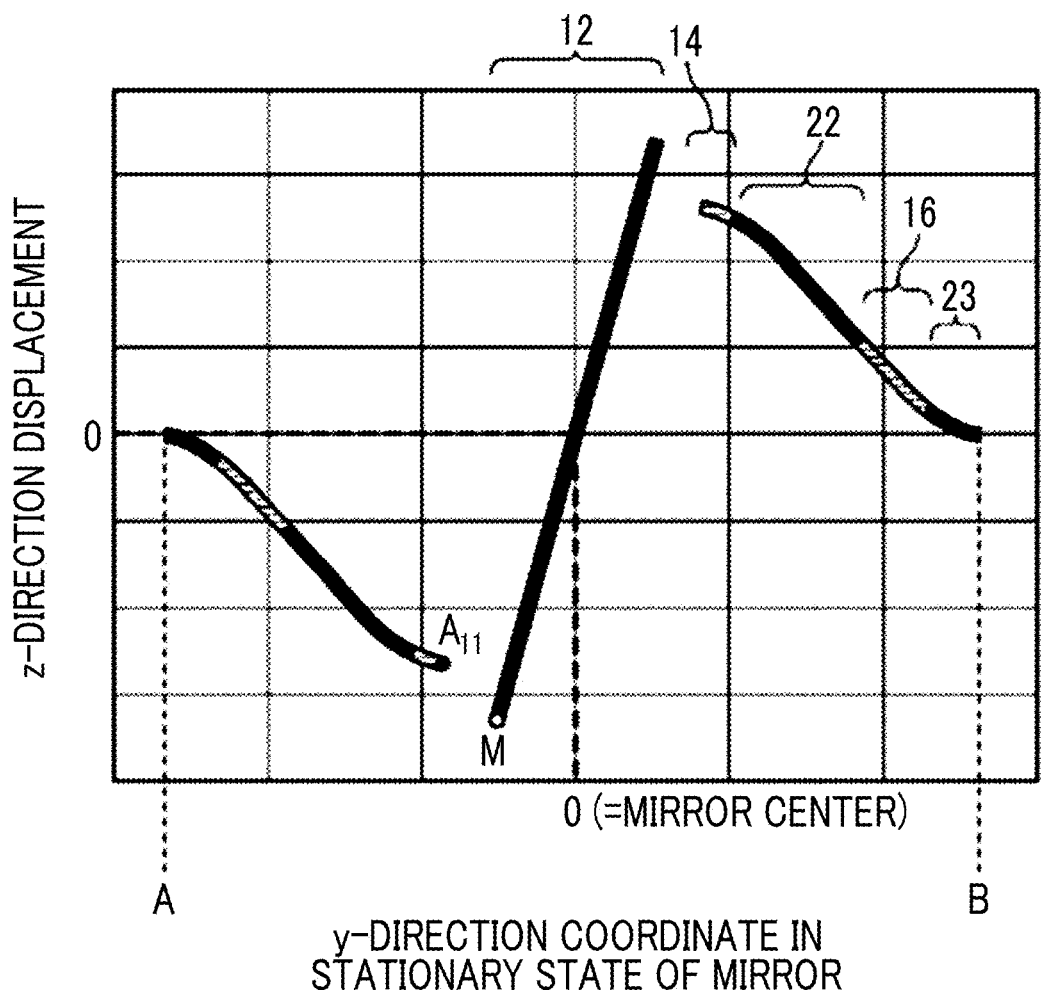
FIG. 6 is a diagram showing a z-direction displacement of each portion of the device between A and B in FIG. 4.
Figure 7:
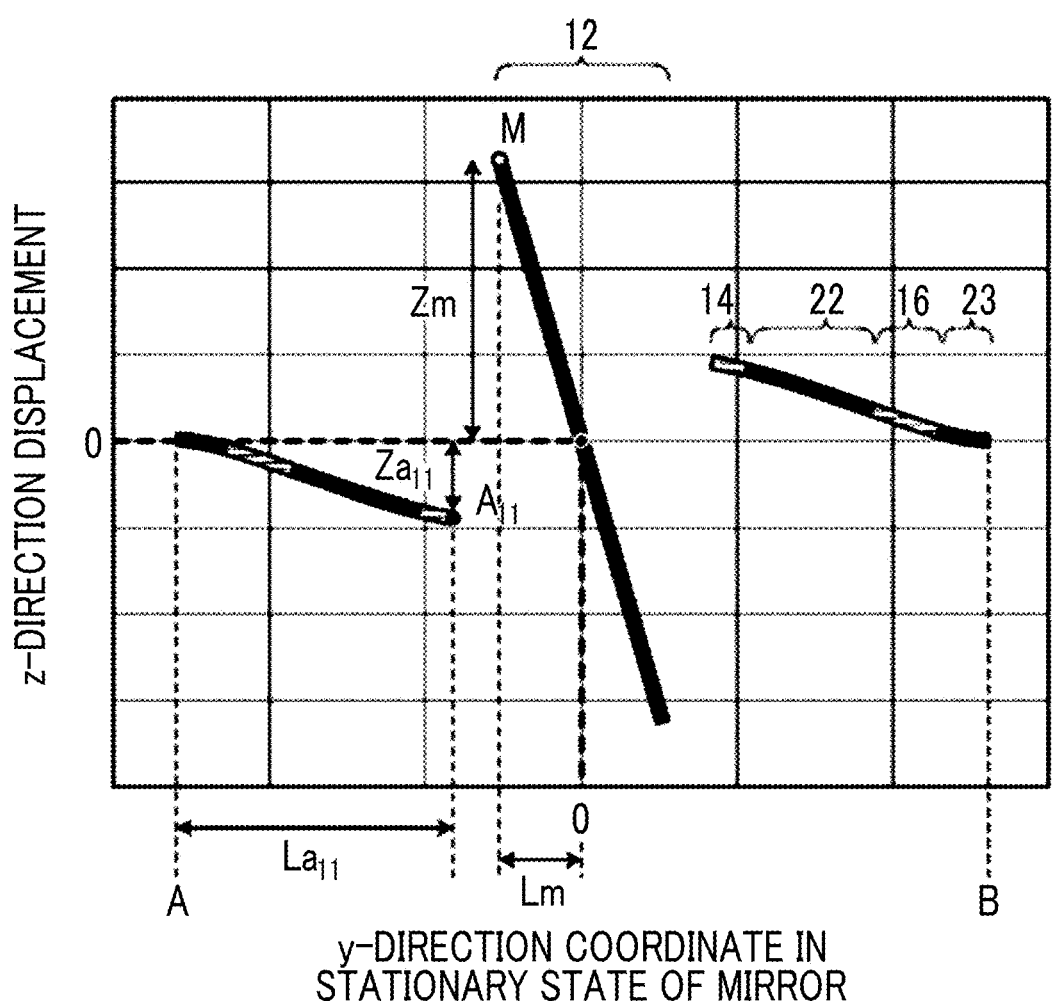
FIG. 7 is a diagram showing the z-direction displacement of each portion of the device between A and B in FIG. 5.

FIGS. 6 and 7 each are a graph showing the z-direction displacement of each portion of the device between A and B in FIGS. 4 and 5. In FIGS. 6 and 7, the horizontal axis is the y-direction coordinate in a case where the mirror is stationary, and the displacement in a case where the mirror is displaced in the z direction is highlighted. FIGS. 6 and 7 each schematically show the amount of displacement of each portion in the y-direction coordinates in a case where the mirror is stationary, and do not show the actual length of each member.

In the resonance mode shown in FIG. 4, the direction of displacement of a point M at the end of the mirror portion 12 on the second axis $a_2$ and the direction of displacement of a point $A_{11}$ on the first actuator 14 closest to the point M at the end of the mirror portion 12 are the same (refer to FIG. 6). That is, the mirror portion 12 and the first actuator 14 oscillate in the same phase. On the other hand, in the resonance mode shown in FIG. 5, the direction of displacement of the point M and the direction of displacement of the point $A_{11}$ are opposite to each other (refer to FIG. 7). That is, the mirror portion 12 and the first actuator 14 oscillate in opposite phases.

Optical scanning is possible using either resonance mode. However, in the resonance mode in which the mirror portion 12 and the first actuator 14 oscillate in opposite phases, the Q value of the resonance oscillation is higher and the resonance frequency is higher than that in the resonance mode in which the mirror portion 12 and the first actuator 14 oscillate in the same phase. As a result, it is more suitable that scanning is performed at high speed. For example, in the micromirror device of Example 1 described later, the resonance frequency of the in-phase resonance mode around the first axis was 35 kHz, and the Q value was 700. On the other hand, the resonance frequency of the resonance mode having the opposite phase around the first axis was 60 kHz, and the Q value was 1900. It is preferable to perform driving in the lowest order mode (which is referred to as the first resonance mode) among the resonance modes in which the mirror portion 12 and the first actuator 14 tilt and oscillate in opposite phases around the first axis since a high Q value can be obtained. Further, the applicants of the present invention found the following. By designing the ratio R1 of the amount of displacement tilt between the points $A_{11}$ and the point M in the first resonance mode to be within the following predetermined range, a structure having low consumed power and high durability can be obtained.

As shown in FIG. 7, the maximum amount of displacement of the point M of the mirror portion 12 in the z direction in a case of oscillating in the first resonance mode is Zm, the distance in the y direction from the point M to the mirror portion center is Lm, the maximum amount of displacement of the point $A_{11}$ of the first actuator 14 in the z direction is $Za_{11}$, and the distance in the y direction from the position A, at which the third connection portion 23 is connected to the fixed portion 20, to point $A_{11}$ is $La_{11}$. Then, the amount of displacement tilt of the point M is defined as $|Zm/Lm|$, and the amount of displacement tilt of the point $A_{11}$ is defined as $|Za_{11}/La_{11}|$.

In a case where the mirror portion 12 and the first actuator 14 are driven in the first resonance mode, it is preferable that the ratio of the amounts of displacement tilt of the points M and A11 $R1=|Zm/Lm|/|Za_{11}/La_{11}|$ is 9.4≤R1≤87. It is more preferable that 16≤R1.

Examples of the method of increasing R1 include a method of lowering the response frequency of the first actuator 14. Specifically, the moment of inertia of the first actuator 14 may be increased, or the second connection portion 22 supporting the first actuator 14 may be elastically softened. In the former case, it is conceivable to increase the width or thickness of the first actuator 14, and in the latter case, it is effective to reduce the width of the second connection portion 22 or increase the length thereof. In order to decrease R1, for example, contrary to the above-mentioned method of increasing R1, a method of increasing the response frequency of the first actuator 14 can be used. Specifically, the moment of inertia of the first actuator 14 may be decreased. Alternatively, the second connection portion 22 that supports the first actuator 14 may be elastically hardened.

By setting R1 to 9.4 or more, a large increase in air resistance can be suppressed. As a result, the Q value at resonance can be increased, and consumed power can be reduced. Further, by setting R1 to 16 or more, it is possible to suppress the displacement of the first actuator from becoming excessively large and to suppress the occurrence of large distortion in the structure. That is, it is possible to suppress the application of an excessively large elastic stress to the piezoelectric film provided on the surface of the movable portion of the first actuator, and to improve the driving durability. On the other hand, by setting R1 to 87 or less, it is possible to suppress the displacement of the first actuator from becoming extremely small, and it is possible to effectively use the energy injected from the piezoelectric film. As a result, consumed power can be reduced. Further, by reducing R1 to 87 or less, it is possible to suppress an increase in the size of the actuator by design. As a result, it is possible to realize a small device.

Next, a resonance mode accompanied by tilt oscillation of the mirror portion around the second axis will be described.

Figure 8:
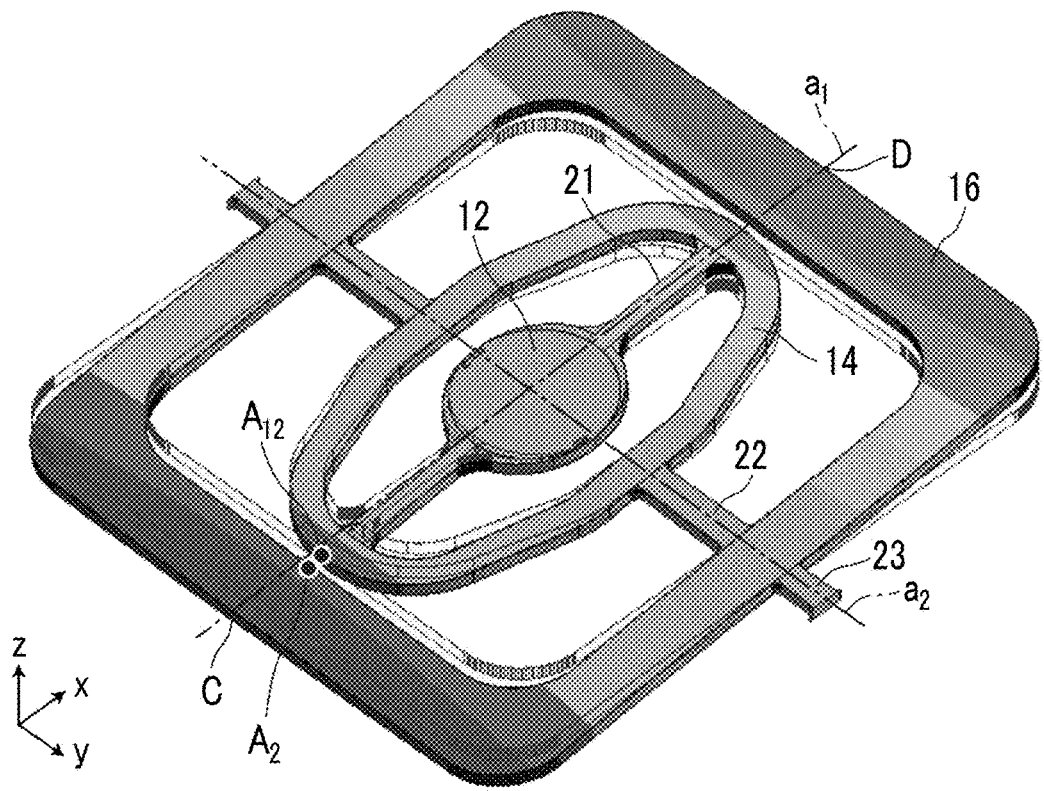
FIG. 8 is a diagram showing a shape displacement of the micromirror device in a case of driving in a resonance mode accompanied by tilt oscillation of the mirror portion around a second axis.
Figure 9:
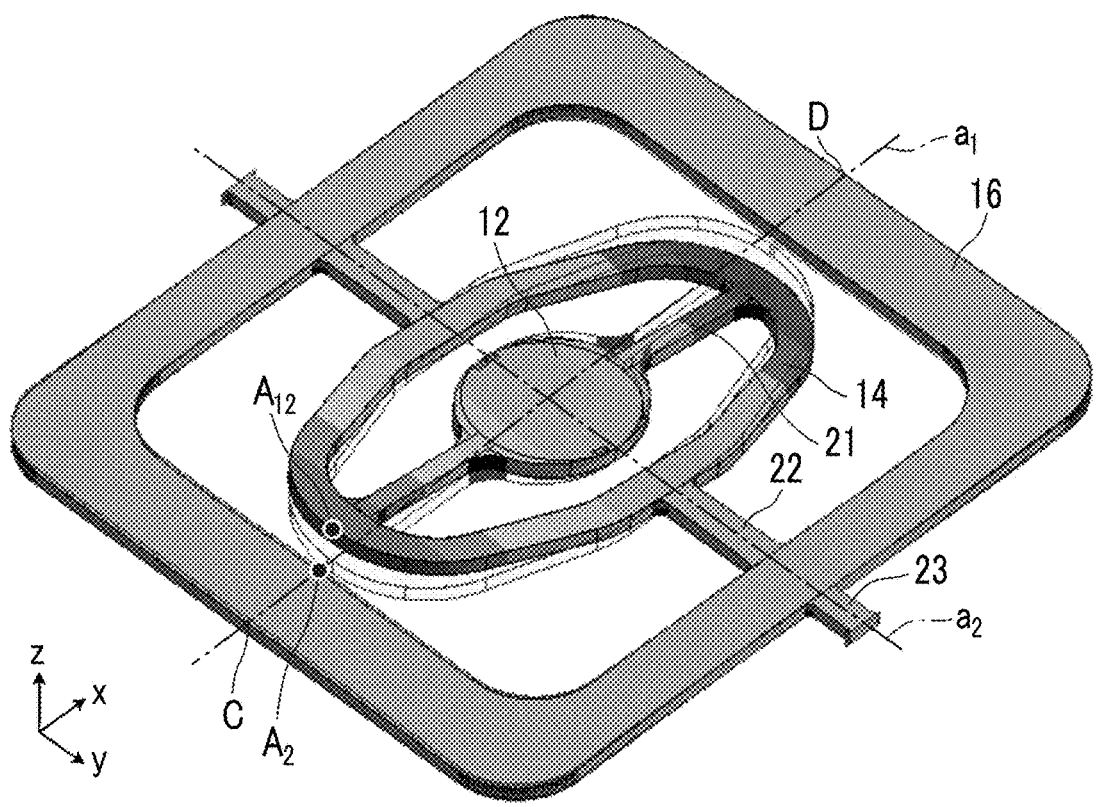
FIG. 9 is a diagram showing a shape displacement of the micromirror device in a case of driving in the resonance mode accompanied by tilt oscillation of the mirror portion around the second axis.

FIG. 8 is a diagram schematically showing the shape displacement of the micromirror device 10 in the lowest order mode of the resonance modes accompanied by the tilt oscillation of the mirror portion 12 around the second axis $a_2$. Further, FIG. 9 is a diagram schematically showing the shape displacement of the micromirror device 10 in the second-order mode next to the mode shown in FIG. 8 among the resonance modes accompanied by the tilt oscillation of the mirror portion 12 around the second axis $a_2$. In FIGS. 8 and 9, the fixed portion 20 is omitted. In addition, the position in a stationary state is indicated by a dashed line, and the darker the color in the figure, the larger the amount of displacement from the stationary state.

Figure 10:
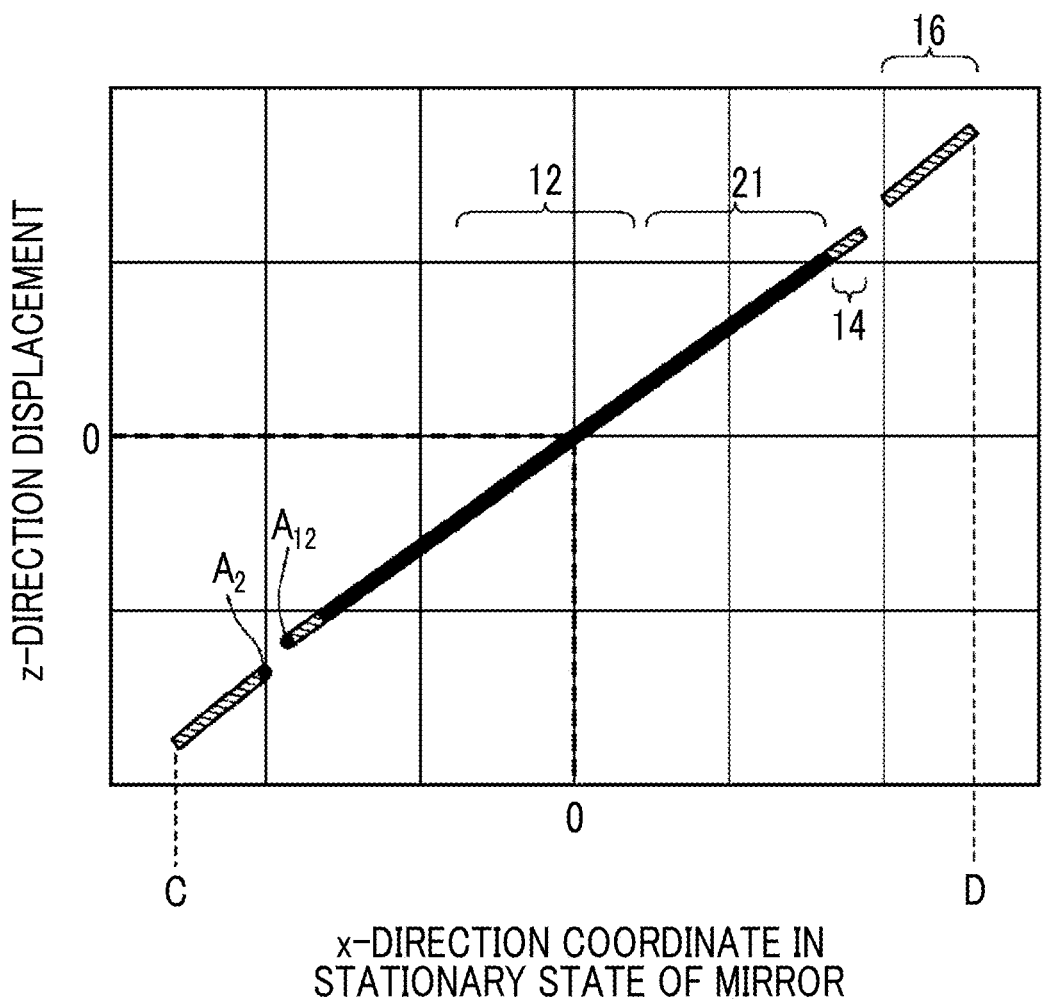
FIG. 10 is a diagram showing the z-direction displacement of each portion of the device between C and D in FIG. 8.
Figure 11:
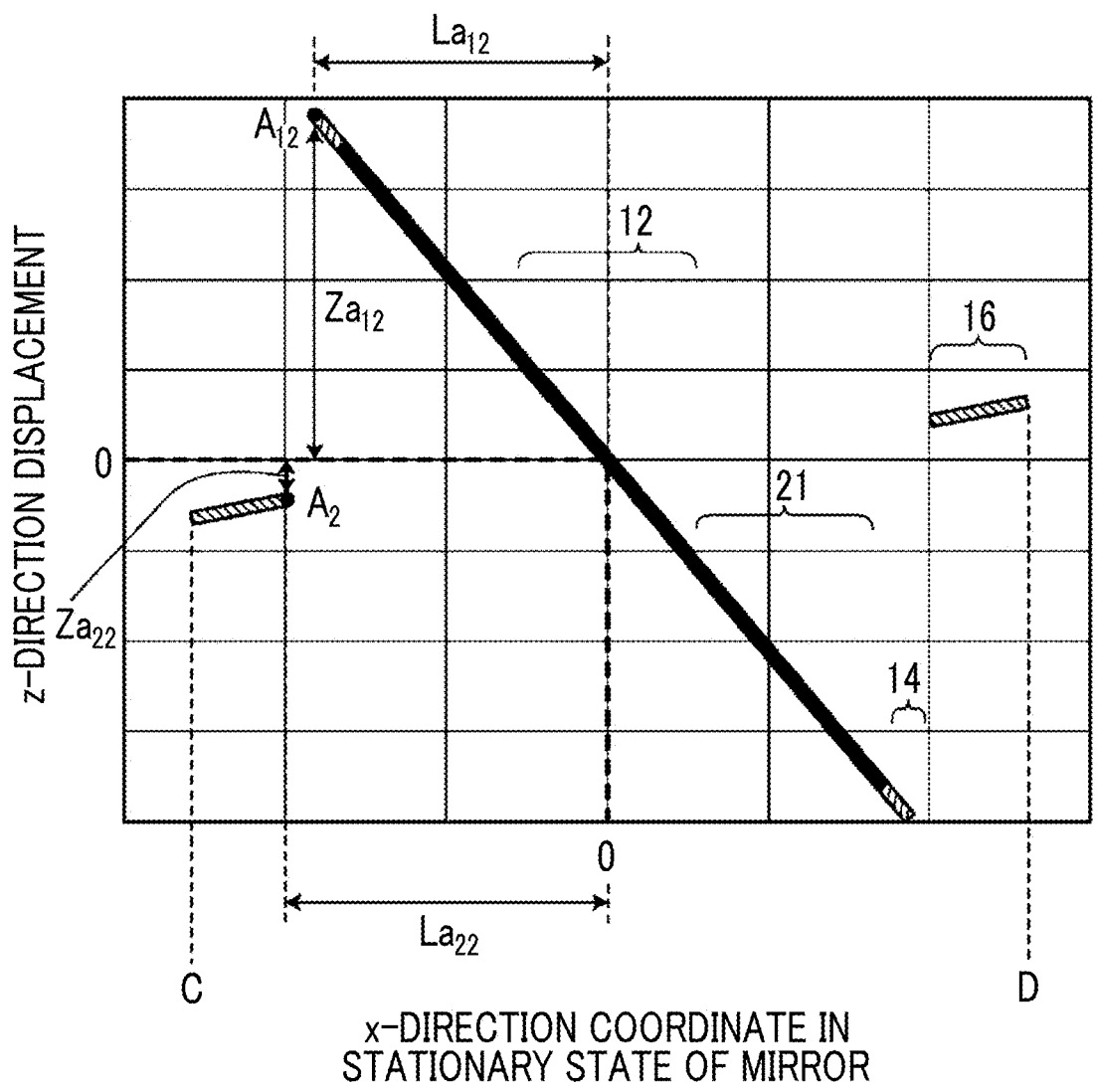
FIG. 11 is a diagram showing the z-direction displacement of each portion of the device between C and D in FIG. 9.

FIGS. 10 and 11 each are a graph showing the z-direction displacement of each portion of the device between C and D in FIGS. 8 and 9. In FIGS. 10 and 11, the horizontal axis is the x-direction coordinate in a case where the mirror is stationary, and the displacement in a case where the mirror is displaced in the z direction is highlighted. FIGS. 10 and 11 each schematically show the amount of displacement of each portion in the x-direction coordinates in a case where the mirror is stationary, and do not show the actual length of each member.

In the resonance mode shown in FIG. 8, the point $A_{12}$ at the end of the first axis $a_1$ of the first actuator 14 and the point $A_{12}$ at the end of the first actuator 14 are closest to each other, and the direction of displacement of point $A_2$ on the second actuator 16 is the same (refer to FIG. 10). That is, the first actuator 14 and the second actuator 16 oscillate in the same phase. On the other hand, in the resonance mode shown in FIG. 9, the displacement directions of the point $A_{12}$ and the point $A_2$ are opposite to each other (refer to FIG. 11). That is, the first actuator 14 and the second actuator 16 oscillate in opposite phases.

The first actuator 14 and the mirror portion 12 oscillate integrally around the second axis $a_2$.

Optical scanning is possible using either resonance mode. However, in the resonance mode in which the first actuator 14 and the second actuator 16 oscillate in opposite phases, the Q value of the resonance oscillation is higher and the resonance frequency is higher than that in the resonance mode in which the first actuator 14 and the second actuator 16 oscillate in the same phase. As a result, it is suitable that scanning is performed at high speed. For example, in the configuration of Example 1 described later, the resonance frequency of the in-phase resonance mode around the second axis was 4.7 kHz, and the Q value was 250. On the other hand, the resonance frequency of the resonance mode having the opposite phase around the second axis was 11 kHz, and the Q value was 940. Therefore, it is preferable to perform driving in the lowest order mode (which is referred to as the second resonance mode) among the resonance modes in which the first actuator 14 and the second actuator 16 tilt and oscillate in opposite phases around the second axis since a high Q value can be obtained. Further, the applicants of the present invention found the following. By designing the ratio R2 of the amount of displacement tilt between the points $A_{12}$ and the point $A_2$ in the second resonance mode to be within the predetermined range, a structure having low consumed power and high durability can be obtained.

As shown in FIG. 11, the maximum amount of displacement of the first actuator 14 in the z direction at the point $A_{12}$ in a case of oscillating in the second resonance mode is $Za_{12}$, the distance in the x direction from the point $A_{12}$ to the mirror center of the mirror portion 12 is $La_{12}$, the maximum amount of displacement of the second actuator 16 in the z direction at the point $A_2$ is $Za_{22}$, and the distance in the x direction from the point $A_2$ to the mirror center of the mirror portion 12 is $La_{22}$. Then, the amount of displacement tilt of the point $A_{12}$ is defined as $|Za_{12}/La_{12}|$, and the amount of displacement tilt of the point $A_2$ is defined as $|Za_{22}/La_{22}|$.

In a case of driving in the lowest order mode of the resonance modes in which the mirror portion 12, the first actuator 14, and the second actuator 16 tilt and oscillate in opposite phases, it is preferable that the ratio of both amounts $R2=|Za_{11}/La_{11}|/|Za_{22}/La_{22}|$ is 0.75≤R2≤27. It is more preferable that 2.3≤R2.

Examples of the method of increasing R2 include a method of lowering the response frequency of the second actuator 16. Specifically, the moment of inertia of the second actuator 16 may be increased, or the third connection portion 23 supporting the second actuator 16 may be elastically softened. In the former case, it is conceivable to increase the width or thickness of the second actuator 16, and in the latter case, it is effective to reduce the width or increase the length of the third connection portion 23. In order to decrease R2, for example, contrary to the above-mentioned method of increasing R2, a method of increasing the response frequency of the second actuator 16 can be used. Specifically, the moment of inertia of the second actuator 16 may be decreased. Alternatively, the third connection portion 23 that supports the second actuator 16 may be elastically hardened.

By setting R2 to 0.75 or more, the displacement of the second actuator can be suppressed and the air resistance can be reduced. As a result, the Q value at resonance can be increased and the consumed power can be reduced. Further, by setting R2 to 2.3 or more, it is possible to suppress the displacement of the second actuator from becoming excessively large and to suppress the occurrence of large distortion in the structure. That is, it is possible to suppress the application of an excessively large elastic stress to the piezoelectric film provided on the surface of the movable portion of the second actuator, and to improve the driving durability. On the other hand, by setting R2 to 27 or less, it is possible to suppress the displacement of the second actuator from becoming extremely small, and it is possible to effectively use the energy injected from the piezoelectric film. As a result, consumed power can be reduced. Further, by reducing R2 to 27 or less, it is possible to suppress an increase in the size of the actuator by design. As a result, it is possible to realize a small device.

In the micromirror device 10, the piezoelectric elements 34A, 34B, 36A, and 36B of the first actuator 14 and the second actuator 16 each are provided with a driving circuit, which is for supplying driving power for driving in the first resonance mode and the second resonance mode, and a control circuit which are not shown. As the driving signal supplied to each of the first actuator 14 and the second actuator 16 by the driving circuit, an AC signal or a pulse waveform signal having a frequency that excites resonance can be used. Specific driving signals will be described below together with the driving method.

A method of driving the micromirror for performing an optical scanning around the first axis and the second axis will be specifically described.

Figure 12:
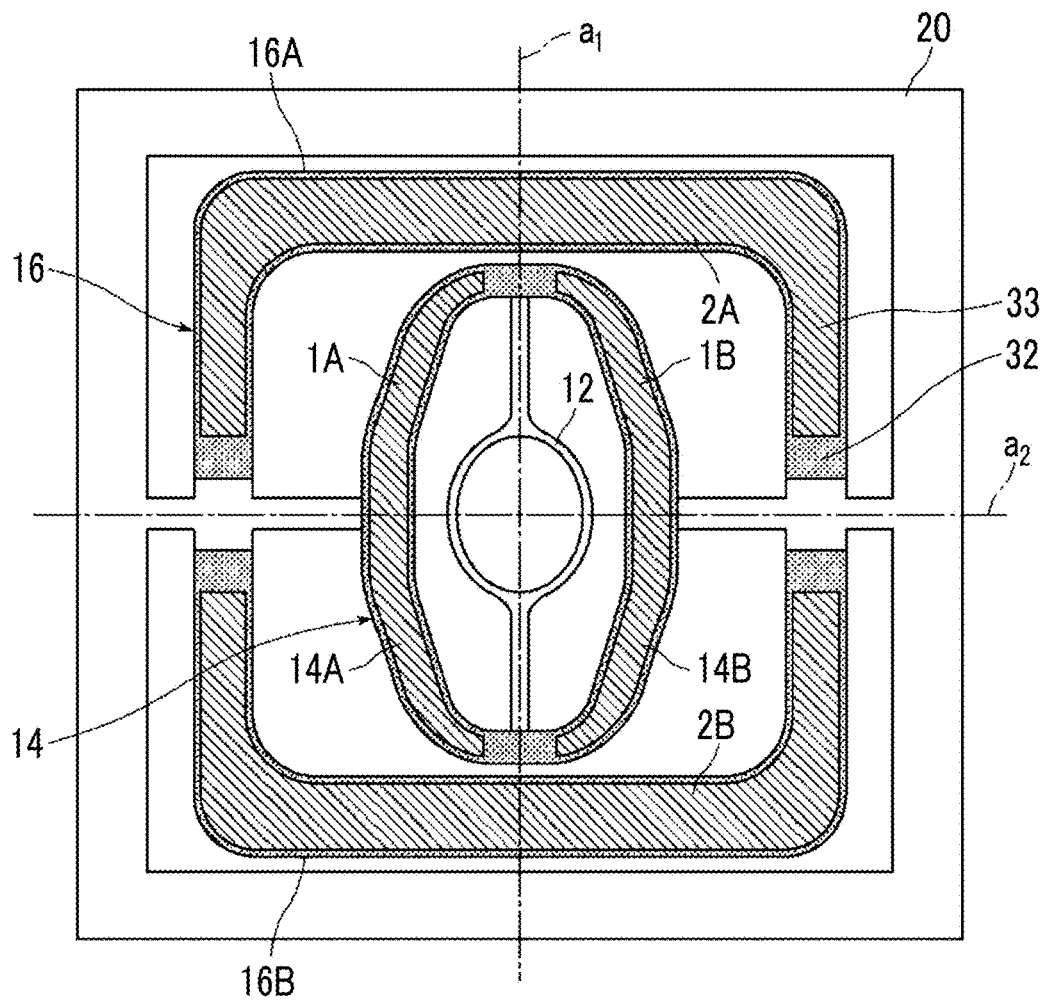
FIG. 12 is a diagram showing an electrode arrangement of upper electrodes of piezoelectric elements provided in the first actuator 14 and the second actuator 16 in the micromirror device 10.

FIG. 12 shows electrode arrangement of upper electrodes 33 of piezoelectric elements 34A, 34B, 36A, and 36B provided in the first actuator 14 and the second actuator 16 in the micromirror device 10 of the embodiments shown in FIGS. 1 to 3. In FIG. 12, the region indicated by diagonal hatching is the upper electrode 33. In the present example, in the first actuator 14, the lower electrode 31 and the piezoelectric film 32 are provided over substantially the entire surface of a pair of first movable portions 14A and 14B, and the upper electrode 33 is provided to be divided into one movable portion 14A and the other movable portion 14B of the pair of first movable portions 14A and 14B. Here, the upper electrodes 33 provided on the first movable portions 14A and 14B are shown as electrodes 1A and 1, respectively. Further, in the second actuator 16, the lower electrode 31 and the piezoelectric film 32 are provided over substantially the entire area of one movable portion 16A and the other movable portion 16B of the pair of second movable portions. The lower electrode 31 and the piezoelectric film 32 provided on one second movable portion 16A and the lower electrode 31 and the piezoelectric film 32 provided on the other movable portion 16B are separated by the second axis $a_2$. The upper electrode 33 is provided on the piezoelectric film 32 of one second movable portion 16A and on the piezoelectric film 32 of the other movable portion 16B, respectively. The upper electrodes 33 provided on the second movable portions 16A and 16B are shown as electrodes 2A and 2B, respectively.

In the configuration provided with the upper electrodes 1A, 1B, 2A, and 2B shown in FIG. 12, the mirror portion 12 is tilted and oscillated around the first axis $a_1$ and the second axis $a_2$, respectively. An example of a driving method for realizing two-dimensional optical scanning in such a configuration will be described.

Figure 13:
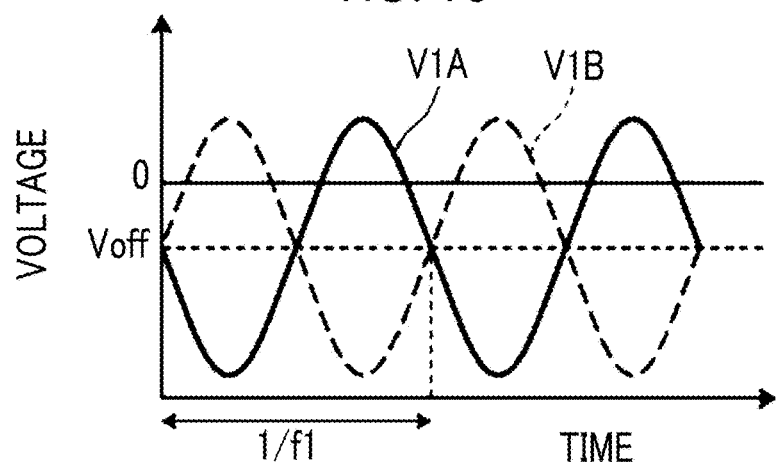
FIG. 13 is a diagram showing driving voltage waveforms V1A and V1B applied to electrodes 1A and 1B in FIG. 12.

FIG. 13 shows a driving voltage waveform (driving signal) applied to the electrodes in order to tilt and oscillate the mirror portion 12 around the first axis $a_1$. In order to excite the first resonance mode, driving voltage waveforms V1A and V1B having frequencies matching the first resonance mode are applied to the electrodes 1A and 1B, respectively. As shown in FIG. 13, the driving voltage waveforms V1A and V1B are in opposite phases (phase difference 180°). By applying such a driving voltage waveform, distortion occurs, such that the first actuator 14 is tilted around the first axis $a_1$. As a result, a rotational torque of the mirror portion 12 around the first axis $a_1$ is given.

The driving voltage waveforms V1A and V1B are represented as follows, respectively.

$V1A = V_{off1A} + V_{A-1A} \sin\omega_1 t$
$V1B = V_{off1B} + V_{A-1B} \sin(\omega_1 t + \varphi)$ In the above expression, $V_{A-1A}$ and $V_{A-1B}$ are voltage amplitudes, $\omega_1$ is the angular frequency for exciting the first resonance mode, t is the time, and $\varphi$ is the phase difference.

In the drawing, $\varphi = 180°$, $V_{A-1A} = V_{A-1B}$, $V_{off1A} = V_{off1B} = V_{off}$.

Figure 14:
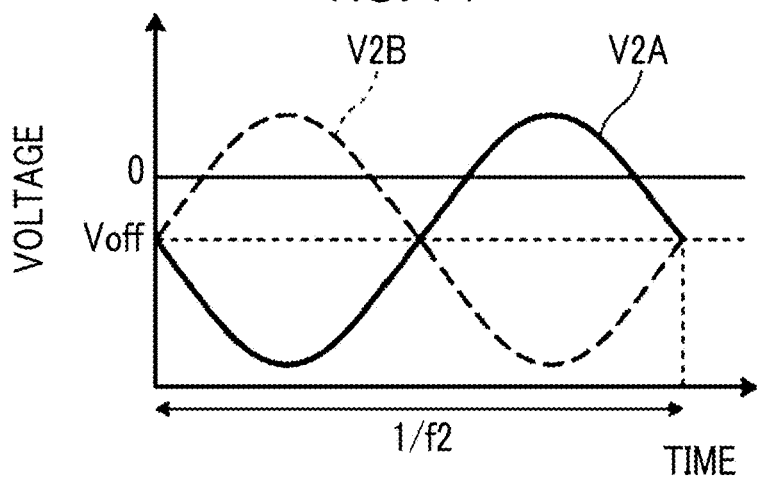
FIG. 14 is a diagram showing driving voltage waveforms V2A and V2B applied to electrodes 2A and 2B in FIG. 12.

FIG. 14 shows a driving voltage waveform applied to the electrodes in order to tilt and oscillate the mirror portion 12 around the second axis $a_2$. In order to excite the second resonance mode, driving voltage waveforms V2A and V2B having frequencies matching the second resonance mode are applied to the electrodes 2A and 2B, respectively. As shown in FIG. 14, the driving voltage waveforms V2A and V2B are in opposite phases (phase difference 180°). By applying such a voltage waveform, distortion occurs, such that the second actuator 16 is tilted around the second axis $a_2$. As a result, a rotational torque around the second axis $a_2$ is applied to the first actuator 14 (and the mirror portion 12).

The driving voltage waveforms V2A and V2B are represented as follows, respectively.

$V2A = V_{off2A} + V_{A-2A} \sin\omega_2 t$
$V2B = V_{off2B} + V_{A-2B} \sin(\omega_2 t + p)$ In the above expression, $V_{A-2A}$ and $V_{A-2B}$ are voltage amplitudes, $\omega_2$ is the angular frequency for exciting the second resonance mode, t is the time, and $\varphi$ is the phase difference.

In the drawing, $\varphi = 180°$, $V_{A-2A} = V_{A-2B}$, $V_{off2A} = V_{off2B} = V_{off}$.

By respectively applying the driving voltage waveforms V1A and V2A to the electrodes 1A and 1B and simultaneously applying the driving voltage waveforms V2A and V2B to the electrodes 2A and 2B, the first resonance mode and the second resonance mode can be simultaneously excited. In such a manner, in a state where the first resonance mode and the second resonance mode are simultaneously excited, for example, by making a laser beam or the like incident on the mirror portion 12, it is possible to perform two-dimensional optical scanning.

The piezoelectric element to which the driving voltage for exciting the first resonance mode is applied is not limited to the piezoelectric element on the first actuator. For example, the first resonance mode can be excited by applying a driving voltage waveform having a frequency corresponding to the first resonance mode to all or a part of the piezoelectric elements on the second actuator. In this case, the upper electrode on the second actuator may be divided into an appropriate number of pieces having appropriate shapes in order to apply a torque around the first axis to the first actuator.

Similarly, the piezoelectric element to which the driving voltage for exciting the second resonance mode is applied is not limited to the piezoelectric element on the second actuator 16. For example, the second resonance mode can be excited by applying a driving voltage waveform having a frequency corresponding to the second resonance mode to all or a part of the piezoelectric elements on the first actuator 14. In this case, the upper electrode 33 on the first actuator 14 may be divided into an appropriate number of pieces having appropriate shapes in order to apply a torque around the second axis to the mirror portion 12.

Further, by simultaneously adding a driving voltage waveform having a frequency matching the resonance frequency of the first resonance mode to all or a part of the first actuator 14 and all or a part of the second actuator 16, the first resonance mode may be excited.

Further, by simultaneously adding a driving voltage waveform having a frequency matching the resonance frequency of the second resonance mode to all or a part of the first actuator and all or a part of the second actuator, the second resonance mode may be excited. The arrangement of the upper electrode 33 as an example for carrying out such a driving method will be described below.

Figure 15:
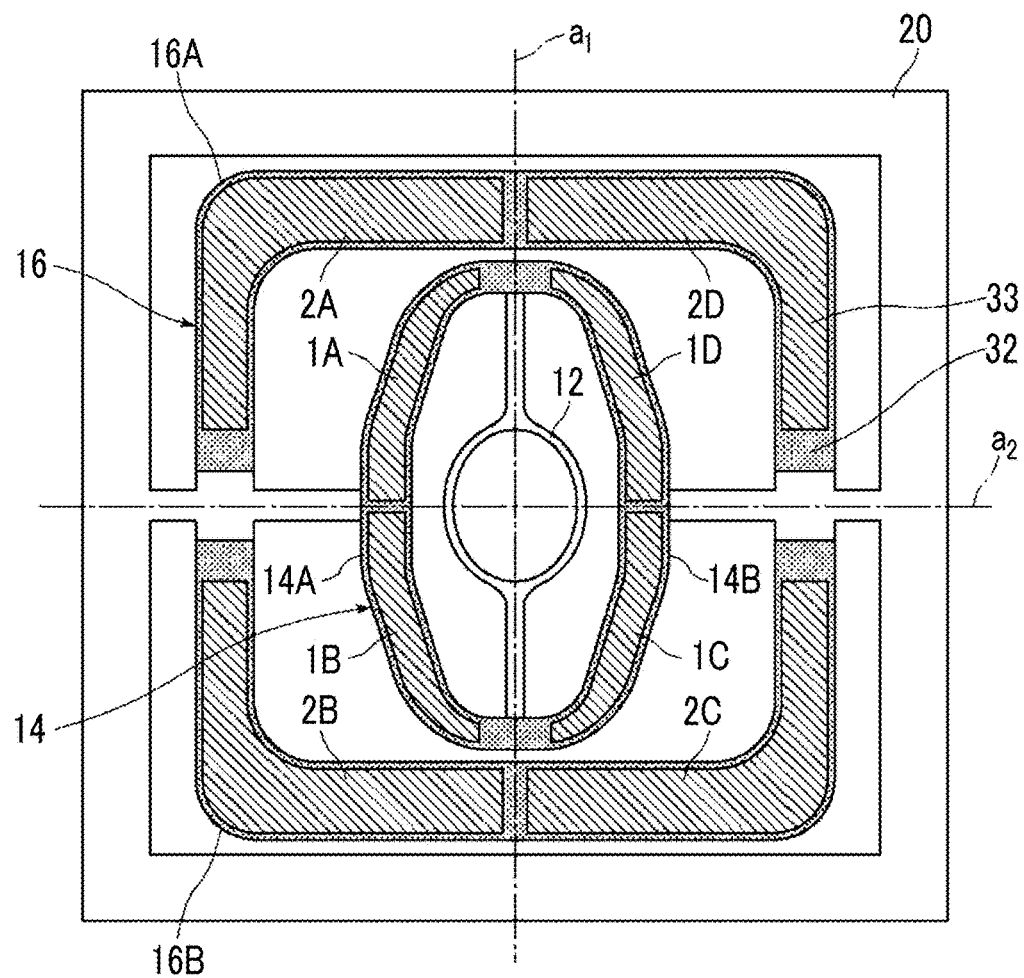
FIG. 15 is a diagram showing an example of design modification of the electrode arrangement of the upper electrode of the piezoelectric element provided in the micromirror device.

FIG. 15 shows upper electrode arrangement of a design modification example of the micromirror device 10. The micromirror device 10 has the same configuration as described above except for the upper electrode arrangement. In this example, the upper electrode 33 on the first actuator 14 is divided into four electrodes 1A, 1B, 1C, and 1D. Further, the upper electrode 33 on the second actuator 16 is divided into two electrodes 2A and 2D on one second movable portion 16A and divided into two electrodes 2B and 2C on the other movable portion 16B. That is, the upper electrode 33 is divided into a total of four electrodes.

In the configuration provided with the electrodes 1A to 1D and 2A to 2D shown in FIG. 15, the mirror portion 12 is tilted and oscillated around the first axis $a_1$ and the second axis $a_2$, respectively. An example of a driving method for realizing two-dimensional optical scanning in such a configuration will be described.

Figure 16:
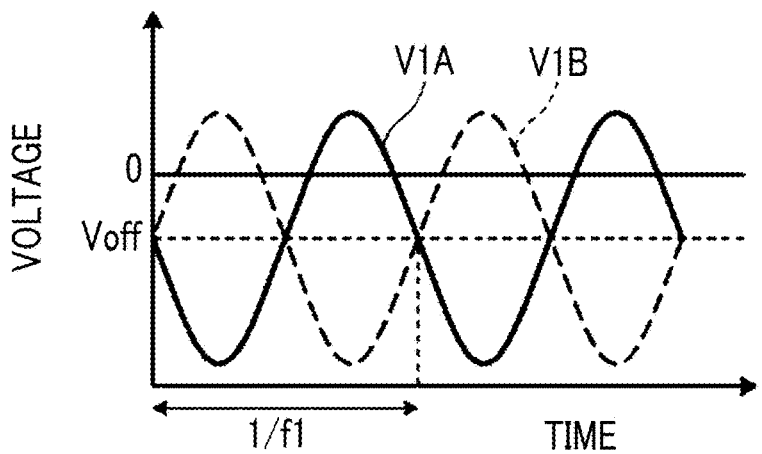
FIG. 16 is a diagram showing a driving voltage waveform V1A applied to the electrodes 1A, 1B, 2A, and 2B and a driving voltage waveform V1B applied to the electrodes 1C, 1D, 2C, and 2D in FIG. 15.

FIG. 16 shows a driving voltage waveform applied to the electrodes in order to tilt and oscillate the mirror portion 12 around the first axis $a_1$. In order to excite the first resonance mode, the driving voltage waveform V1A having a frequency matching the first resonance mode is applied to the electrodes 1A, 1B, 2A, and 2B, and the driving voltage waveform V1B having a frequency matching the first resonance mode is applied to the electrodes 1C, 1D, 2C, and 2D. As shown in FIG. 16, the driving voltage waveforms V1A and V1B are in opposite phases (phase difference 180°). By applying such a driving voltage waveform, distortion occurs, such that the first actuator 14 and the second actuator 16 are tilted around the first axis $a_1$. As a result, a rotational torque around the first axis $a_1$ is applied to the mirror portion 12.

The driving voltage waveforms V1A and V1B are represented by the above-mentioned expressions, but the voltage amplitudes of the driving voltage waveforms given to the respective electrodes may not be the same or may be different. For example, the voltage amplitude of the driving voltage waveform applied to the electrodes 1A and 1B may be different from the voltage amplitude of the driving voltage waveform applied to the electrodes 2A and 2B.

Figure 17:
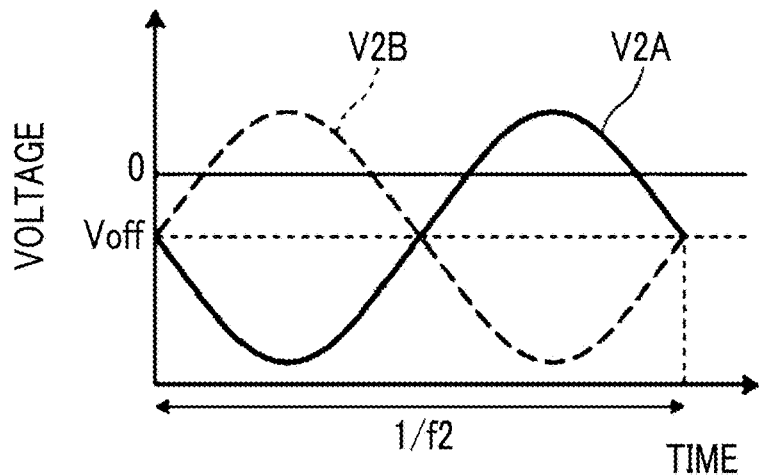
FIG. 17 is a diagram showing a driving voltage waveform V2A applied to electrodes 1A, 1D, 2A, and 2D and a driving voltage waveform V2B applied to electrodes 1B, 1C, 2B, and 2C in FIG. 15.

FIG. 17 shows a driving voltage waveform applied to the electrodes in order to tilt and oscillate the mirror portion 12 around the second axis $a_2$. In order to excite the second resonance mode, the driving voltage waveform V2A having a frequency matching the second resonance mode is applied to the electrodes 1A, 1D, 2A, and 2D, and the driving voltage waveform V2B having a frequency matching the second resonance mode is applied to the electrodes 1B, 1C, 2B, and 2C. As shown in FIG. 17, the driving voltage waveforms V2A and V2B have opposite phases (phase difference 180°). By applying such a driving voltage waveform, distortion occurs, such that the first actuator 14 and the second actuator 16 are tilted around the second axis $a_2$. As a result, a rotational torque around the second axis $a_2$ is applied to the first actuator 14 (and the mirror portion 12). The driving voltage waveforms V2A and V2B are represented by the above-mentioned expressions, but the voltage amplitudes of the driving voltage waveforms given to each electrode may be different. For example, the voltage amplitude of the driving voltage waveform applied to the electrodes 1A and 1D and the voltage amplitude of the driving voltage waveform applied to the electrodes 2A and 2D may be different.

Further, also in the device having this configuration, it is possible to perform a two-dimensional optical scanning by simultaneously exciting the first resonance mode and the second resonance mode. By applying a driving voltage waveform, in which the driving voltage waveform V1A or V1B for exciting the first resonance mode described above and the driving voltage waveform V2A or V2B for exciting the second resonance mode are superimposed, to the electrodes 1A to 1D and 2A to 2D of the first actuator 14 and the second actuator 16, the first and second resonance modes can be excited at the same time.

The micromirror device may further include at least one of a sensor for monitoring the tilt of the mirror portion around the first axis or a sensor for monitoring the tilt of the mirror portion around the second axis.

The micromirror device 10 (refer to FIG. 2) comprises a sensor electrode 51 on a piezoelectric film 32 near the connection region of the first connection portion 21 of one movable portion 14A of the first actuator 14, and a sensor electrode 52 on the piezoelectric film 32 near the connection region with the second connection portion 22 of one movable portion 16B of the second actuator 16. The lower electrode and the piezoelectric film are shared with the piezoelectric element for the actuator, and the sensor electrodes 51 and 52 are provided in a region where the upper electrode 33 is not provided. According to this configuration, a part of the piezoelectric film 32 provided on the first actuator 14 and the second actuator 16 can be used in a sensor for tilt monitoring in such a manner.

In a case where the piezoelectric film 32 is provided over substantially the entire area of the first actuator 14 as in the micromirror device 10 of the above embodiment, the stress magnitude of the freely specified portion of the piezoelectric film 32 can be converted to voltage and monitored. In a case where it is desired to accurately monitor the tilt of the mirror portion 12 around the first axis $a_1$, by monitoring the stress of a part closest to the first connection portion 21 (the connection region with the first actuator 14) that twists in accordance with the angle, it is possible to obtain the best accuracy. As described above, the sensor electrode 51 is provided on the piezoelectric film 32 near the connection region of the first connection portion 21 of one movable portion 14A of the first actuator 14. Therefore, in a case where the scanning around the first axis $a_1$ is performed, the stress at the base of the first connection portion 21 can be monitored, and thus monitoring can be performed with high accuracy.

The lower electrode 31 in a part of in which the sensor electrode 51 is provided is set to a ground potential and the sensor electrode 51 is set to a release potential. By measuring the potential, a voltage proportional to the stress generated in the sensor portion can be obtained. Since the twist angle of the first connection portion 21 is proportional to the stress of the sensor portion, the tilt of the mirror portion 12 can be monitored.

Similarly, in a case where it is desired to accurately monitor the tilt of the mirror portion 12 of the second axis (that is, the tilt of the first actuator 14), by monitoring the stress of a part closest to the second connection portion 22 (the connection region with the second actuator 16) that twists in accordance with the angle, it is possible to obtain the best accuracy. As described above, the sensor electrode 52 is provided on the piezoelectric film 32 near the connection region with the second connection portion 22 of one movable portion 16B of the second actuator 16. Therefore, in a case where the scanning around the second axis $a_2$ is performed, the stress at the base of the second connection portion 22 can be monitored, and thus the monitoring can be performed with high accuracy.

The lower electrode 31 in a part of in which the sensor electrode 52 is provided is set to a ground potential and the sensor electrode 52 is set to a release potential. By measuring the potential, a voltage proportional to the stress generated in the sensor portion can be obtained. Since the twist angle of the second connection portion 22 is proportional to the stress of the sensor portion, the tilt of the mirror portion 12 can be monitored.

Figure 18:
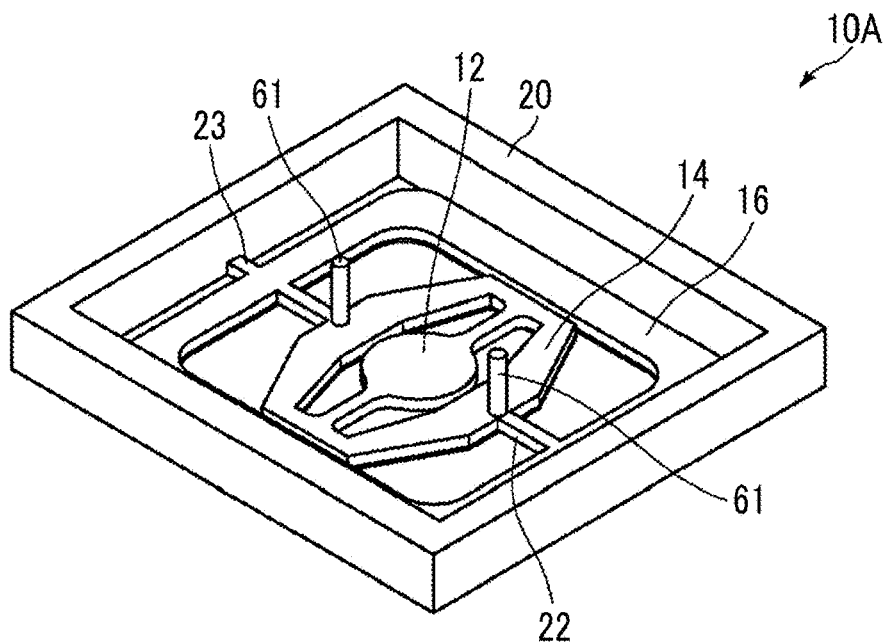
FIG. 18 is a perspective view showing the back surface of the micromirror device of Design Modification Example 1.

Further, the micromirror device may be provided with the first stopper portion on a back surface of the first actuator 14 in order to improve the strength against vertical displacement. FIG. 18 is a perspective view showing a back surface of a micromirror device 10A of a design modification example in which the first stopper portion 61 is provided on the back surface of the first actuator 14. Here, in the micromirror device, the surface of the mirror portion 12 including the reflective surface 12a is the front surface, and the opposite surface is the back surface.

The first stopper portion 61 is provided on the second axis $a_2$ on the back surface of the first actuator 14. The first stopper portion 61 has the same thickness as the fixed portion 20. The thickness error of 10% or less means that the thicknesses are the same.

FIG. 19 is a perspective view (upper drawing) showing a state in which the micromirror device 10A is driven in the first resonance mode and the mirror portion 12 is tilted obliquely about the first axis $a_1$, and a cross-sectional view (lower drawing) taken along the line $B_1$-$B_2$ in the perspective view.

In the micromirror device 10A, the fixed portion 20 is fixed on the substrate 60 by the adhesive 65. The thickness of the first stopper portion 61 is the same as that of the fixed portion 20, but since the entire thickness of the adhesive 65 is raised, the first stopper portion 61 does not come into contact with the substrate 60 in a case where the mirror portion is stationary. Further, in a case where driving is performed in the first resonance mode and the above-mentioned $R1=|Zm/Lm|/|Za_{11}/La_{11}|$ is 9.4<R1<87, the portion on the first axis $a_1$ is hardly displaced. Therefore, the first stopper portion 61 does not come into contact with the substrate 60 and does not interfere with the driving. The thickness of the adhesive 65 is generally about 20 to 100 m. In a case where an adhesive containing a filler having an appropriate particle size is used as needed, the thickness of the adhesive can be accurately controlled and the raised height can be controlled.

Figure 20:
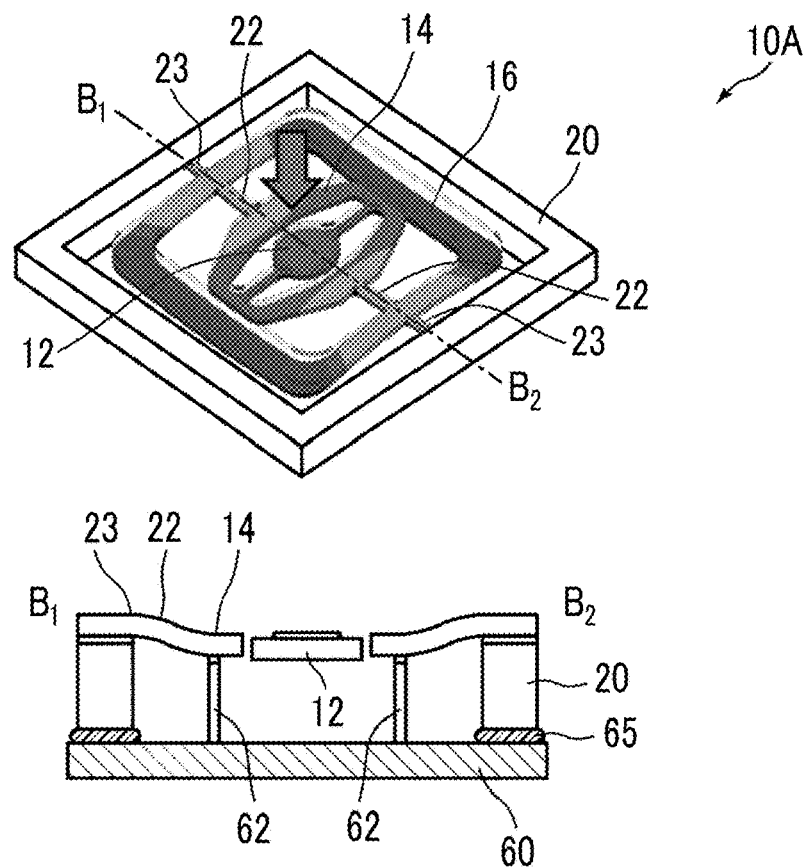
FIG. 20 is a perspective view schematically showing a displacement in a case where an impact is applied to the micromirror device of FIG. 18 in the z direction, and a cross-sectional view taken along the line $B_1$-$B_2$.

FIG. 20 is a perspective view (upper drawing) schematically showing the displacement generated in the device 10A in a case where an impact is applied to the micromirror device 10A in the z direction, and a cross-sectional view (lower drawing) taken along the line $B_1$-$B_2$ in the perspective view. In the upper drawing of FIG. 20, the displacement at the time of impact is shown by shading. The darker the color, the larger the displacement.

In a case where shock oscillation occurs in the vertical direction from the outside, the first actuator 14 and the second actuator 16 are largely vertically displaced, but the first stopper portion 61 collides with the substrate 60 before being excessively displaced. Therefore, it is possible to prevent stress failure due to excessive displacement.

Figure 21:
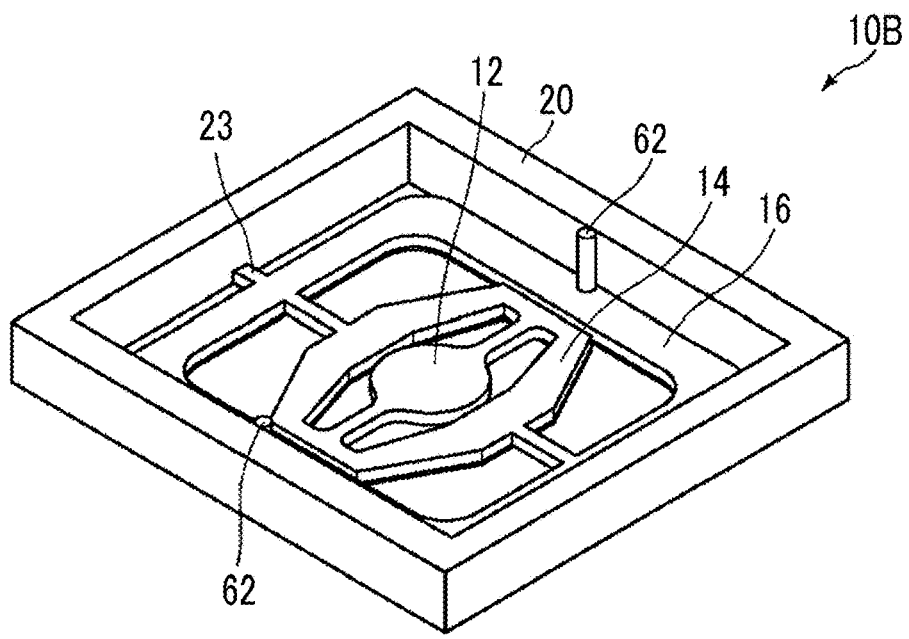
FIG. 21 is a perspective view showing the back surface of the micromirror device of Design Modification Example 2.

The micromirror device may be provided with a second stopper portion on the back surface of the second actuator in order to improve the strength against vertical displacement. FIG. 21 is a perspective view showing the back surface of the micromirror device 10B of the design modification example in which the second stopper portion 62 is provided on the back surface of the second actuator 16.

The second stopper portion 62 is provided on the first axis $a_1$ on the back surface of the second actuator 16. The second stopper portion 62 has the same thickness as the fixed portion 20. The thickness error of 10% or less means that the thicknesses are the same.

FIG. 22 is a perspective view (upper drawing) showing a state in which the micromirror device 10B is driven in the second resonance mode and the first actuator 14 and the mirror portion 12 are tilted obliquely about the second axis $a_2$, and a cross-sectional view (lower drawing) taken along the line $B_1$-$B_2$ in the perspective view.

In the micromirror device 10B, the fixed portion 20 is fixed on the substrate 60 by the adhesive 65. The thickness of the second stopper portion 62 is the same as that of the fixed portion 20, but since the entire thickness of the adhesive 65 is raised, the second stopper portion 62 does not come into contact with the substrate 60 in a case where the mirror is stationary. Further, in a case where driving is performed in the second resonance mode and the above-mentioned $R2=|Za_{12}/La_{12}|/|Za_{22}/La_{22}|$ is 0.75<R2<27, the displacement of the second actuator 16 is small, and the second stopper portion 62 does not come into contact with the substrate 60 and does not interfere with the driving. The thickness of the adhesive 65 is the same as that in the case of the micromirror device 10A.

Figure 23:
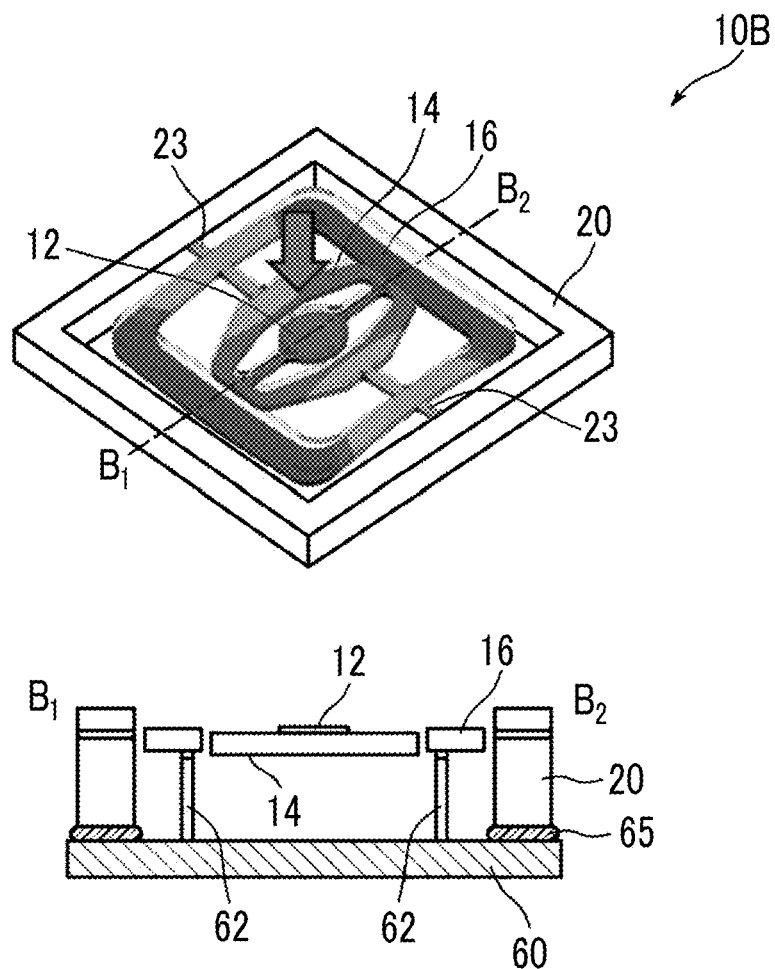
FIG. 23 is a perspective view schematically showing a displacement in a case where an impact is applied to the micromirror device of FIG. 21 in the z direction, and a cross-sectional view taken along the line $B_1$-$B_2$.

FIG. 23 is a perspective view (upper drawing) schematically showing the displacement generated in the device 10B in a case where an impact is applied to the micromirror device 10B in the z direction, and a cross-sectional view (lower drawing) taken along the line $B_1$-$B_2$ in the perspective view. In the upper drawing of FIG. 23, the displacement at the time of impact is shown by shading. The darker the color, the larger the displacement.

In a case where shock oscillation occurs in the vertical direction from the outside, the first actuator 14 and the second actuator 16 are largely vertically displaced, but the second stopper portion 62 collides with the substrate 60 before being excessively displaced. Therefore, it is possible to prevent stress failure due to excessive displacement.

The back surface of the first actuator 14 may be provided with the first stopper portion 61, and the back surface of the second actuator 16 may be provided with the second stopper portion 62.

The piezoelectric element provided in the first actuator 14 and the second actuator 16 will be described. As described above, the piezoelectric element has a laminated structure of a lower electrode, a piezoelectric film, and an upper electrode.

The thickness of the lower electrode and the upper electrode is not particularly limited, and is, for example, about 200 nm. The thickness of the piezoelectric film is not particularly limited as long as it is 10 m or less, and is usually 1 m or more, for example, 1 to 5 m. The method for forming the lower electrode, the upper electrode and the piezoelectric film is not particularly limited, but the vapor deposition method is preferable, and the sputtering method is particularly preferable.

The main components of the lower electrode are not particularly limited, and are metals or metal oxides such as Au, Pt, Ir, $IrO_2$, $RuO_2$, $LaNiO_3$, and $SrRuO_3$, and combinations thereof.

The main component of the upper electrode is not particularly limited, and examples thereof include materials exemplified for the lower electrode, electrode materials generally used in semiconductor processes such as Al, Ti, Ta, Cr, and Cu, and combinations thereof.

Examples of the piezoelectric film include those containing one or more types of perovskite-type oxides (P) represented by the following formula.

General formula $ABO_3$ (P) (In the formula, A is an element of A site, and at least one element containing Pb. B is an element of B site, and at least one element selected from the group consisting of Ti, Zr, V, Nb, Ta, Sb, Cr, Mo, W, Mn, Sc, Co, Cu, In, Sn, Ga, Zn, Cd, Fe, and Ni. 0 is an oxygen element. The standard molar ratio of A-site element, B-site element, and oxygen element is 1: 1: 3, but the molar ratio may deviate from the reference molar ratio within a range in which a perovskite structure can be obtained.)

Examples of the perovskite-type oxide represented by the above general formula include lead-containing compounds such as lead titanate, lead zirconate titanate (PZT), lead zirconate tit, lead zirconate tit lanthanate, lead zirconate titanate lanthanate, lead zirconate titanate magnesium niobate, lead zirconate titanate titanate, and lead zirconate titanate zinc niobate, and mixed crystal systems thereof; lead-free compounds such as barium titanate, strontium barium titanate, bismas sodium niobate, potassium niobate potassium, niobate, sodium, potassium niobate, lithium niobate, and bismas ferrite, and mixed crystal systems thereof.

Further, the piezoelectric film of the present embodiment preferably contains one kind or two or more kinds of perovskite-type oxides (PX) represented by the following formula.

$$A_a(Zr_x,Ti_y,M_{b-x-y})_bO_c \quad (PX)$$

(In the formula, A is an element of A site, and at least one element containing Pb. M is at least one element selected from a group consisting of V, Nb, Ta, and Sb. $0<x<b$, $0<y<b$, $0\leq b-x-y$, and a: b: c=1: 1: 3 are standard, but these molar ratios may deviate from the reference molar ratio within the range where a perovskite structure can be obtained.)

Since the piezoelectric film consisting of the perovskite-type oxide represented by the above general formulas (P) and (PX) has a high piezoelectric strain constant ($d_{31}$ constant), the piezoelectric actuator comprising such a piezoelectric film is excellent in displacement characteristics. The perovskite-type oxide represented by the general formula (PX) has a higher piezoelectric constant than that represented by the general formula (P).

Further, the piezoelectric actuator comprising the piezoelectric film consisting of the perovskite-type oxide represented by the general formulas (P) and (PX) has a voltage-displacement characteristic with excellent linearity in the driving voltage range. These piezoelectric materials exhibit good piezoelectric properties in carrying out the present invention.

EXAMPLES

Hereinafter, the micromirror devices of examples and comparative examples of the present invention will be described.

<Example 1; Example of Specific Manufacturing Method>

As Example 1, the micromirror device 10 having the configurations shown in FIGS. 1 to 3 was produced by the following procedure.

(Step 1) A Ti layer with 30 nm was formed and an Ir layer with 150 nm was formed, at a substrate temperature of 350° C., by a sputtering method, on an silicon on insulator (SOI) substrate having a laminated structure of a Si handle layer 350 µm, a silicon oxide ($SiO_2$) box layer 1 µm, and a Si device layer 100 µm. The laminated structures of the Ti layer and the Ir layer correspond to the lower electrode 31 in FIG. 3.

(Step 2) A piezoelectric film with 3 µm was formed on the substrate on which the lower electrodes (Ti/Ir) obtained above were laminated and formed using a radio frequency (RF) sputtering device. As the target material for sputtering film formation for the piezoelectric film, a material having a composition of $Pb_{1.3}((Zr_{0.52}Ti_{0.48})_{0.88}Nb_{0.12})O_3$ was used. The film forming pressure was 2.2 mTorr, and the film forming temperature was 450° C. The obtained piezoelectric film was an Nb-doped PZT thin film to which Nb was added at an atomic composition ratio of 12%.

(Step 3) An upper electrode having a Pt/Ti laminated structure was patterned by a lift-off method, on the substrate on which the piezoelectric film obtained above was formed.

(Step 4) After that, the piezoelectric film and the lower electrode were pattern-etched by inductively coupled plasma (ICP) dry etching.

(Step 5) Further, an insulating layer consisting of $SiO_2$ was formed on the entire surface by a chemical vapor deposition method (TEOS-CVD: tetraethoxysilane-chemical vapor deposition) using tetraethoxysilane as a raw material, and then the insulating layer was patterned by the ICP dry etching.

(Step 6) A laminated structure of Au/Ti was formed into a pattern, and a reflective surface of a mirror portion, an electrode pad, and a wiring layer were formed, by the lift-off method.

(Step 7) The device layer was pattern-etched by a silicon dry etching process to process the shapes of the actuator, the mirror portion, and the fixing member.

(Step 8) Next, the handle layer was subject to deep-drilled reactive ion etching from the back surface of the substrate. Basically, the handle layer was removed so that a part to be a fixing member remains. In a case where a stopper structure described later is added (Example 2), a thick part having the same thickness as the fixed frame is formed by removing the handle layer so that a shape as a stopper on the back surface of the second actuator remains.

(Step 9) Finally, the micromirror device 10 described with reference to FIGS. 1 to 3 was manufactured by removing the box layer from the back surface by dry etching.

In the above manufacturing step, the reflective surface of the mirror portion is formed in Step 6, but the reflective surface may be formed by using a reflective material different from the material of the electrode pad and the wiring layer. In that case, for example, subsequently to Step 6, the reflective surface may be formed by a lift-off method or the like.

In carrying out the present invention, the present invention is not limited to the configuration and manufacturing method of Example 1, and the substrate material, electrode material, piezoelectric material, film thickness, film forming conditions, and the like may be appropriately selected in accordance with the purpose.

Figure 24:
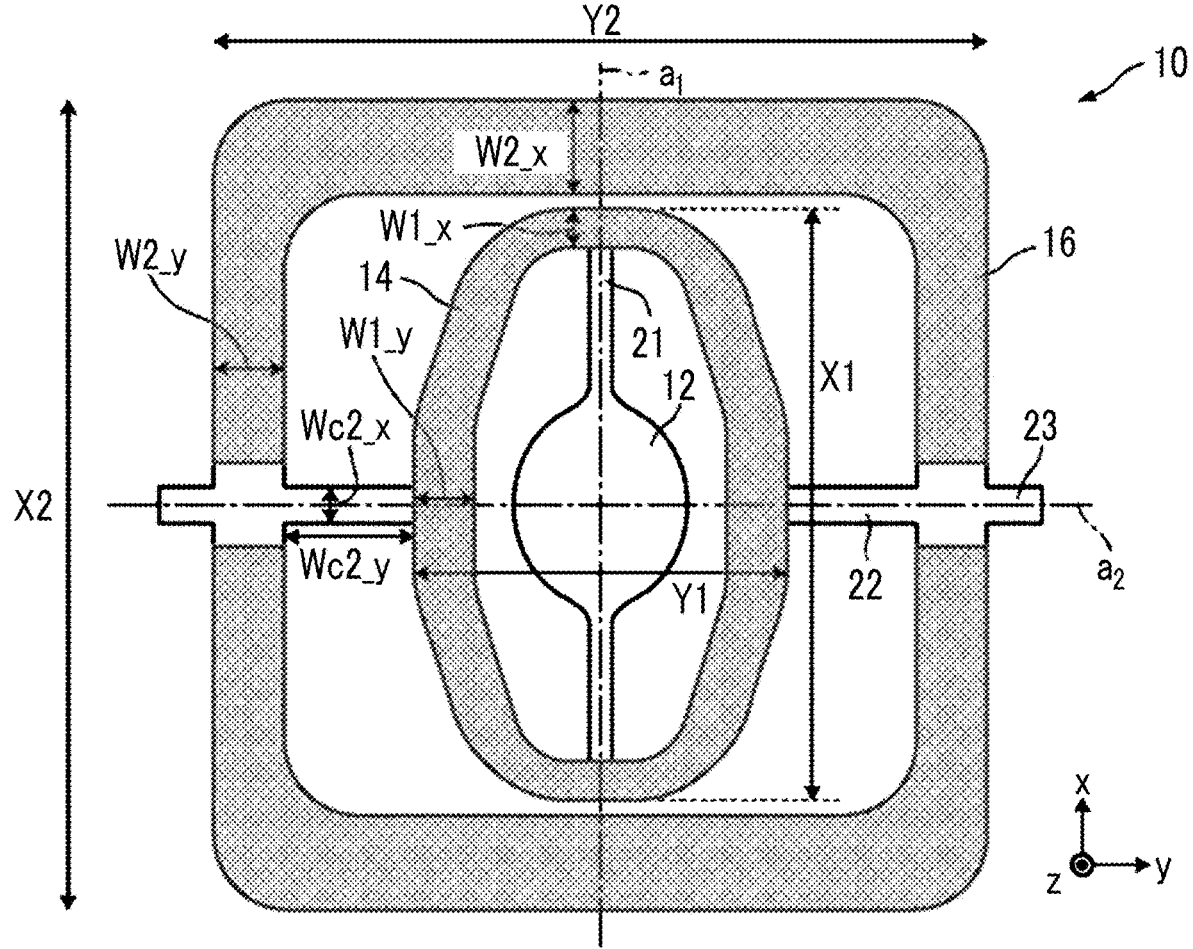
FIG. 24 is a plan view of the micromirror device of Example 1 and defines the dimensions of each portion in the test example.

In FIG. 24, the regions where the piezoelectric films 32 of the first actuator 14 and the second actuator 16 are provided in the present example are shown by dotted hatch portions.

In FIG. 24, the upper electrode, wiring, and the like are not shown. Also, the fixed frame is not shown. In the present example, various dimensions are defined as shown in FIG. 24.

The x-axis direction (second axis direction) length of the first actuator 14 is X1, the y-axis direction (first axis direction) length of the first actuator 14 is Y1, the x-axis direction width of the first movable portion 14A (and 14B) on the first axis $a_1$ is W1_x, and the y-axis direction width of the first movable portion 14A (and 14B) on the second axis $a_2$ is W1_y.

The x-axis direction length of the second actuator 16 is X2, the y-axis direction length of the second actuator 16 is Y2, the x-axis direction width of the second movable portion 16A (and 16B) on the first axis $a_1$ is W2_x, and the y-axis direction width of the second movable portion 16A (and 16B) on the second axis $a_2$ is W2_y.

The x-axis direction length of the second connection portion 22 is Wc2_x and the y-axis direction width is Wc2_y.

Various dimensions in Example 1 were as follows.

A mirror shape was a circular with a diameter of 1.1 mm, first actuator dimensions were X1=2.67 mm, Y1=3.77 mm, W1_x=0.6 mm, and W1_y=0.25 mm, second actuator dimensions were X2=5.17 mm, Y2=5.17 mm, W2_x=0.45 mm, and W2_y=0.6 mm, second connection portion were Wc2_x=0.8 mm, and Wc2_y=0.238 mm, and the thickness of the device layer was td=0.1 mm.

The thicknesses of the mirror portion 12, the first actuator 14, the second actuator 16, and the first connection portion 21, the second connection portion 22, and the third connection portion 23 are equal to the thickness of the device layer.

Then, in the micromirror device having this configuration, the dimensions of the first connection portion 21 and the third connection portion 23 were set so that the frequency of the first resonance mode was about 60 kHz and the frequency of the second resonance mode was about 10 kHz.

The micromirror device of Example 1 excites the first resonance mode by giving the first driving voltage waveform to the first actuator, and causes the mirror portion 12 to rotate around the first axis $a_1$. In this case, the frequency of the first driving voltage waveform is maintained around the frequency of the first resonance mode. Further, by giving the second driving voltage waveform to the second actuator, the second resonance mode is excited, and the first actuator 14 and the mirror portion 12 are substantially integrated to rotate around the second axis $a_2$. Again, the frequency of the second driving voltage waveform is maintained around the frequency of the second resonance mode. By applying these two driving voltage waveforms to the respective actuators at the same time, it is possible to scan the light two-dimensionally.

Comparative Example 1

Figure 25:
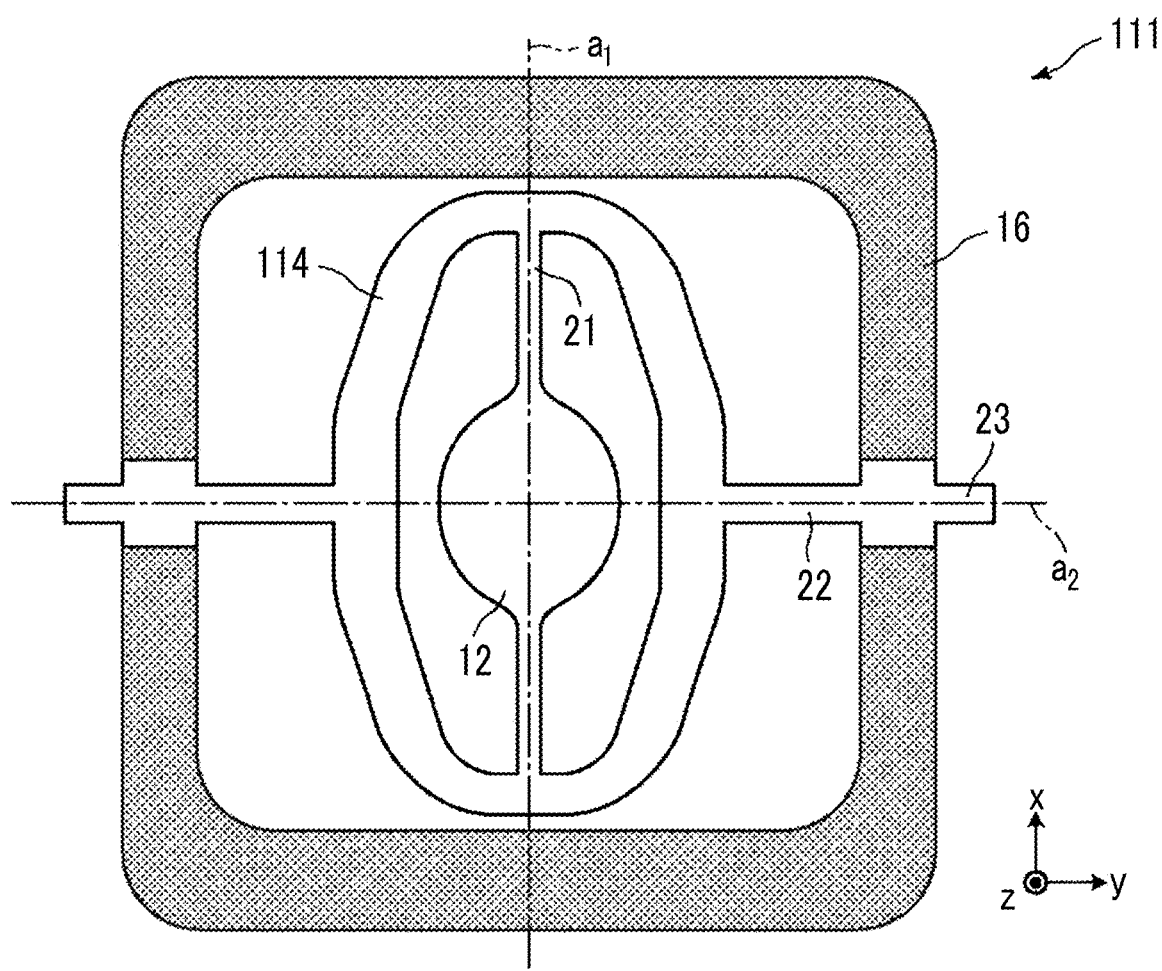
FIG. 25 is a plan view of the micromirror device of Comparative Example 1.

FIG. 25 shows a front view of the micromirror device 111 of Comparative Example 1. Also in FIG. 25, the region where the piezoelectric film is provided is shown by a dot-hatched portion, and the upper electrode, wiring, fixed frame, and the like are not shown. The same components as in Example 1 are represented by the same reference numerals. The shape and dimensions of each portion were the same as in Example 1. The micromirror device 111 of Comparative Example 1 is different from that of Example 1 in that the first actuator 114 does not include a piezoelectric film (that is, a piezoelectric element). The first actuator 114 of Comparative Example 1 is a component that is not strictly an "actuator" since the component does not include a piezoelectric element. However, for convenience, as compared with the first actuator 14 of Example 1, the component is referred to as a first actuator 114.

In the micromirror device 111 of Comparative Example 1, the first driving voltage waveform having a frequency matching the first resonance mode and the second driving voltage waveform having a frequency matching the second resonance mode are superimposed, and are applied to the second actuator 16. Thereby, both resonance modes can be excited, the mirror portion 12 can be rotated around the first axis $a_1$, and the first actuator 114 and the mirror portion 12 can be substantially integrated to rotate around the second axis $a_2$. Thereby, it is possible to scan the light two-dimensionally.

Comparative Example 2

Figure 26:
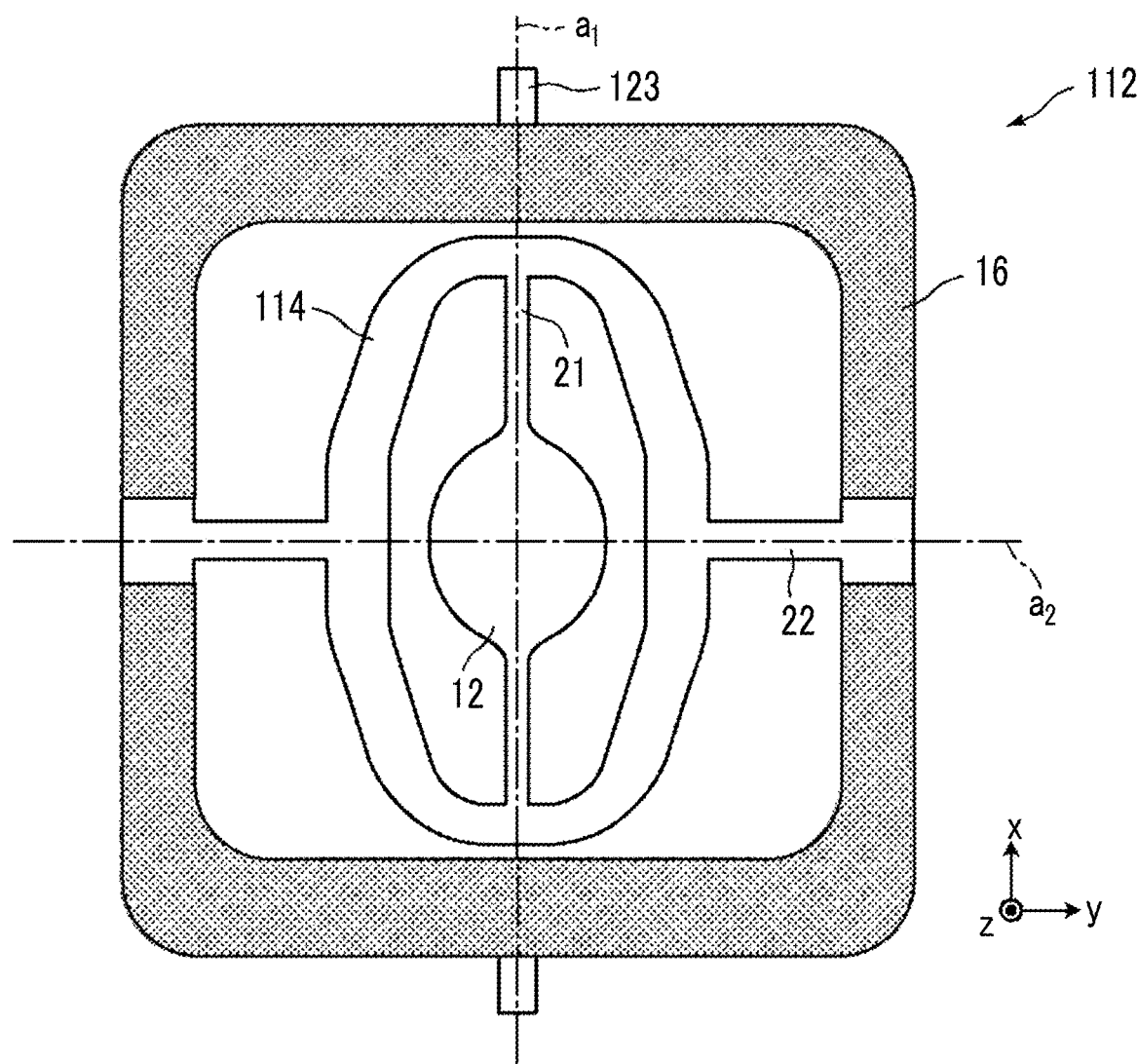
FIG. 26 is a plan view of the micromirror device of Comparative Example 2.

FIG. 26 shows a front view of the micromirror device 112 of Comparative Example 2. Also in FIG. 26, the region where the piezoelectric film is provided is shown by a dot-hatched portion, and the upper electrode, wiring, fixed frame, and the like are not shown. The same components as in Comparative Example 1 are represented by the same reference numerals.

The micromirror device 112 of Comparative Example 2 has the same structure as that of Comparative Example 1 except that the third connection portion 123 is present on the first axis $a_1$. The third connection portion 123 is connected to a fixed portion which is not shown.

The micromirror device 112 of Comparative Example 2 can scan light two-dimensionally by the same method as that of Comparative Example 1.

The micromirror devices of Example 1, Comparative Example 1 and Comparative Example 2 were driven in the first resonance mode and the second resonance mode. Then, the driving voltage amplitudes for 450 scanning around the first axis $a_1$ and 30° scanning around the second axis $a_2$, consumed power, driving durability, and linearity of the scanning around the second axis were investigated. Table 1 shows the results.

TABLE 1

| | Driving voltage amplitude for 45° scanning around first axis (V) | Driving voltage amplitude for 30° scanning around second axis (V) | Consumed power (mW) | Driving durability (h) | Linearity of scanning around second axis |
|---|---|---|---|---|---|
| Example 1 | 4 | 5.5 | 9 | >1400 | Good |
| Comparative example 1 | 8 | 5.5 | 35 | 180 | Good |
| Comparative example 2 | 9 | 12 | 60 | 100 | Poor |

The driving voltage amplitude for 450 scanning around the first axis is an amplitude value of the sine wave required to achieve the optical scan angle of 450 around the first axis during driving at the resonance frequency of the first resonance mode.

The driving voltage amplitude for 30° scanning around the second axis is an amplitude value of the sine wave required to achieve an optical scan angle of 30° around the second axis during driving at the resonance frequency of the second resonance mode.

As a method of measuring the optical scan angle, the following method was used. Laser is vertically incident on the reflective surface of the mirror portion of the micromirror device, the length of the scanning line is measured using a ruler, and the like, and the total angle of scanning is calculated from the geometrical relationship.

The consumed power was calculated based on the following method.

As the driving voltage waveform V, a sine wave represented by $V=V_{off}+V_A \sin\omega t$ was given for driving. A current measuring circuit measured current that flows through each upper electrode during driving. Specifically, a known resistor was connected in series to the electrode to be measured, and the current flowing through each electrode was measured by measuring the voltage across the resistor. The consumed power $W=1/2 \times I_A V_A \cos\omega$ was calculated from the current waveform $I=I_{off}+I_A \sin(\omega t+\varphi)$ measured at this time and the driving voltage waveform V.

The driving durability is a shorter time of the time at which the optical scan angle around the first axis attenuates to 300 or less and the time at which the optical scan angle around the second axis attenuates to 200 or less, in a case where continuous driving is performed while maintaining resonance with a sinusoidal voltage signal having the above driving voltage amplitude.

The linearity of the scanning around the second axis was evaluated by examining the frequency dependence (frequency characteristics) of the scan angle. The driving voltage waveform before and after the resonance frequency of the second resonance mode was applied to the piezoelectric element of the second actuator, and the frequency dependence of the scan angle was measured.

Figure 27:
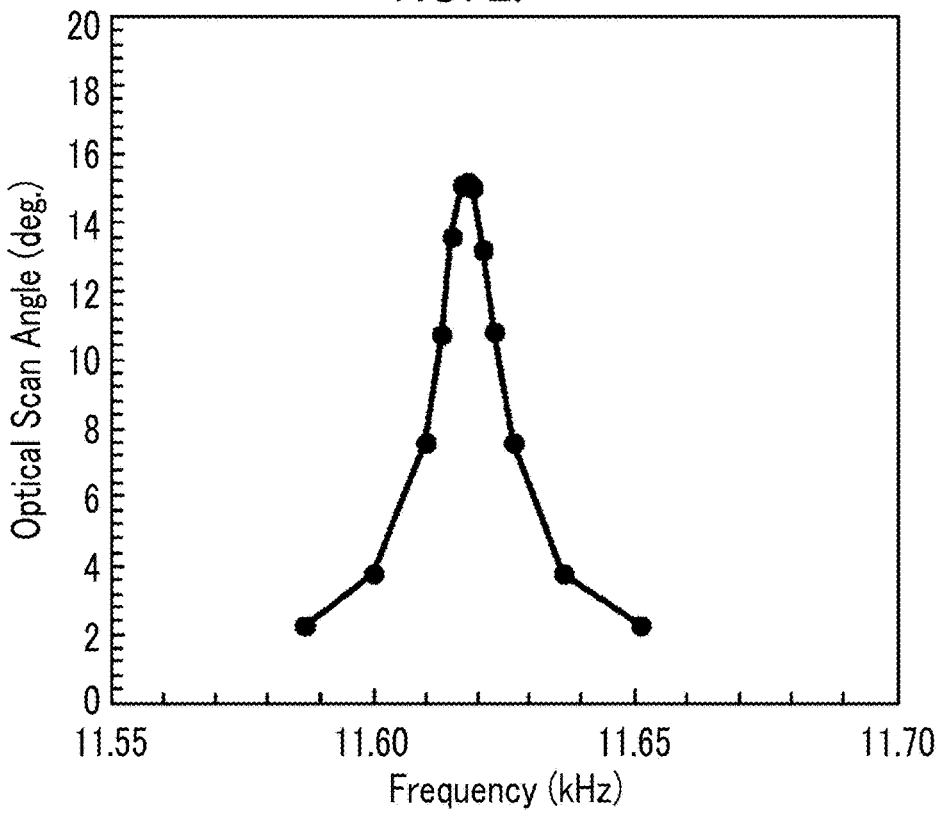
FIG. 27 is a graph showing frequency characteristics of Example 1.
Figure 28:
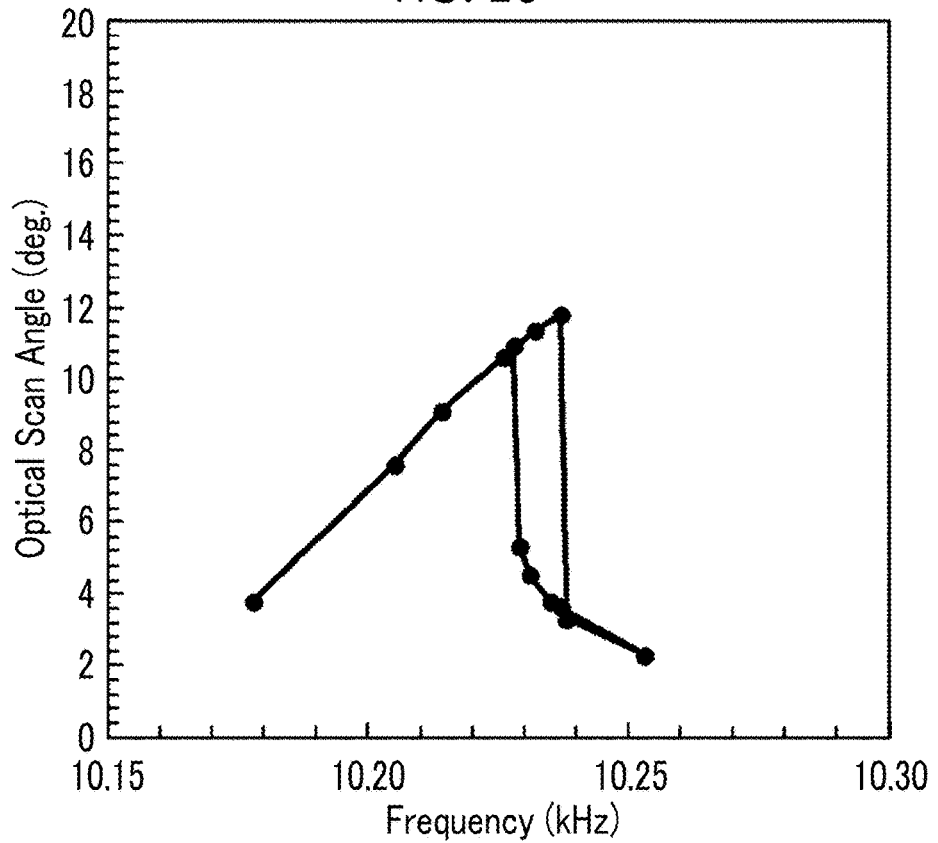
FIG. 28 is a graph showing frequency characteristics of Comparative Example 2.

FIG. 27 is a graph showing the frequency characteristics of Example 1, and FIG. 28 is a graph showing the frequency characteristics of Comparative Example 2. As shown in FIG. 27, the micromirror device of Example 1 shows a peak which is symmetric about the resonance frequency (here, 11.62 kHz), and it can be seen that the linearity is favorable. On the other hand, as shown in FIG. 28, the resonance peak of the micromirror device of Comparative Example 2 is asymmetric, and it is possible to obtain a result of a strong non-linearity (poor linearity).

As shown in Table 1, the structure of Example 1 is superior to the structures of Comparative Examples 1 and 2 in terms of consumed power, driving durability, and linearity. In Example 1, the first actuator 14 includes a piezoelectric film (that is, a piezoelectric element). Thereby, a driving force can be generated. On the other hand, in Comparative Example 1, the first actuator 114 does not have the piezoelectric film. Therefore, it is not possible to generate a driving force. That is, the first actuator 114 functions as a movable frame and simply increases the mass. Therefore, the driving efficiency is lower than that of Example 1. As a result, it is considered that the consumed power becomes high.

In Comparative Example 2, the third connection portion 123 is present on the first axis. As a result of driving the micromirror device 112 of Comparative Example 2 around the second axis, it was found that asymmetry of the resonance peak was strong as shown in FIG. 28. In the structure of Comparative Example 2, the deformed shape of the second actuator 16 in a case where the first actuator 114 and the mirror portion 12 are tilted and displaced around the second axis is complicated. Therefore, it is considered that the non-linearity becomes stronger.

Regarding the micromirror device having the configuration of Example 1, the driving characteristics of the second resonance mode (around the second axis) in a case where R1 is changed, and the driving characteristics of the first resonance mode (around the first axis) in a case where R2 is changed will be described with reference to a test example.

Each R1 and R2 was realized by changing the dimensions of each portion defined in FIG. 24.

<Second Resonance Mode Characteristic Evaluation: Test Examples 1 to 8>

Test Examples 1 to 8 were designed so that the shape of the mirror portion 12 was a circle with a diameter of 1.1 mm, the dimensions of the first actuator were W1_y=0.25 mm, W1_x=0.6 mm, X=2.67 mm, and Y1=3.77 mm, and the resonance frequency of the first resonance mode was about 60 kHz. In each case, the resonance frequency of the second resonance mode was designed to be about 10 kHz. Test Example 5 is the micromirror device of Example 1. For the micromirror device of each test example, a sinusoidal voltage signal having a frequency corresponding to the resonance frequency of the second resonance mode in which the second actuator, the first actuator, and the mirror portion tilt and oscillate in opposite phases is applied to the second actuator. As a result, the mirror portion was tilted and driven around the second axis.

Table 2 shows the dimensions of each test example and the test results.

TABLE 2

|  | W2_y (mm) | W2_x (mm) | Y2 (mm) | X2 (mm) | R2 | Q value | Driving voltage amplitude (V) | Consumed power (mW) | Driving durability (h) | Element area (mm²) |
|---|---|---|---|---|---|---|---|---|---|---|
| Test example 1 | 0.1 | 0.3 | 4.17 | 4.87 | 0.59 | 660 | 24 | 12.7 | 0.5 | 34 |
| Test example 2 | 0.1 | 0.45 | 4.17 | 5.17 | 0.75 | 670 | 21 | 10 | 2 | 36 |
| Test example 3 | 0.2 | 0.45 | 4.37 | 5.17 | 1.4 | 725 | 10 | 5 | 200 | 36 |
| Test example 4 | 0.3 | 0.45 | 4.57 | 5.17 | 2.3 | 800 | 7.4 | 4 | >1400 | 37 |
| Test example 5 | 0.6 | 0.45 | 5.17 | 5.17 | 6.3 | 940 | 5.5 | 4.5 | >1400 | 39 |
| Test example 6 | 0.8 | 0.45 | 5.57 | 5.17 | 10 | 1010 | 5.3 | 5.5 | >1400 | 40 |
| Test example 7 | 1 | 0.45 | 5.97 | 5.17 | 16 | 1020 | 5.6 | 7.9 | >1400 | 42 |
| Test example 8 | 1.2 | 0.45 | 6.37 | 5.17 | 27 | 1050 | 6 | 9.9 | >1400 | 43 |

The driving voltage amplitude is an amplitude value of the sine wave required to achieve an optical scan angle of 300 around the second axis during driving at the resonance frequency of the second resonance mode.

The consumed power is the consumed power in a case where the 30' optical scanning (one-dimensional scanning) is performed around the second axis without scanning around the first axis. The consumed power was calculated by the same method as in Example 1.

The driving durability is the time until the optical scan angle is attenuated to 20' or less by performing continuous driving while maintaining resonance with a sinusoidal voltage signal having the voltage amplitude.

The element area is an area of the xy plane of the micromirror device including the fixed portion.

Figure 29:
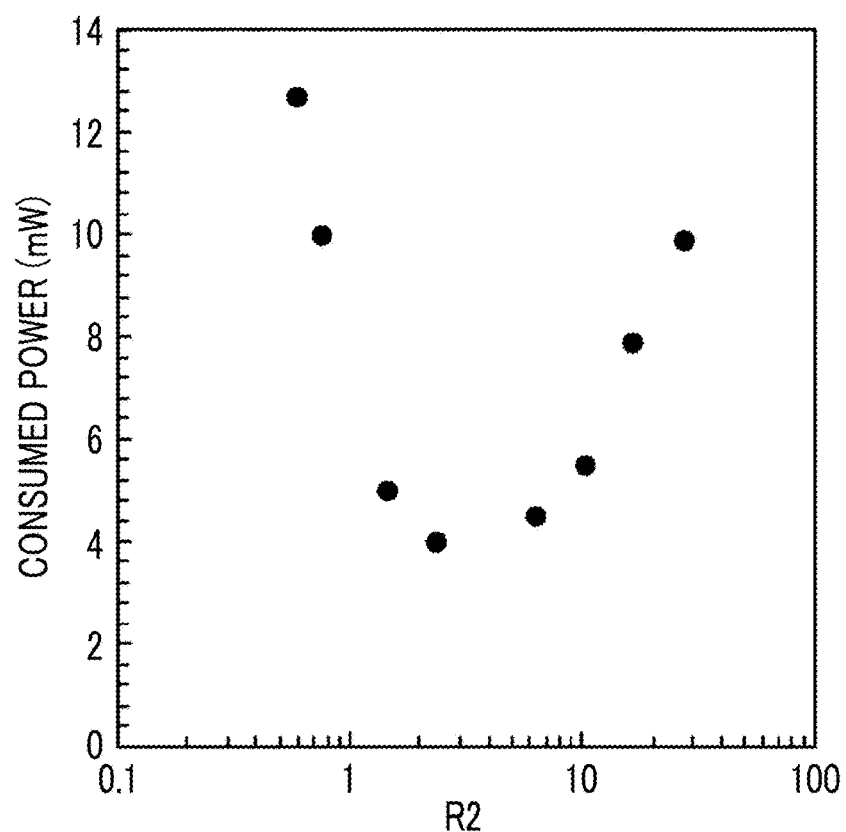
FIG. 29 is a graph showing a relationship between R2 and consumed power.

FIG. 29 is a graph showing the relationship between R2 and consumed power obtained in the test examples shown in Table 2. The amount of consumed power required for a micromirror device depends on the system. Therefore, although not described generally, but the dimensions of the actuator should be designed so that R2 is within the range of 0.75 or more and 27 or less in any application. Thereby, it is possible to achieve a value that is lower than the consumed power required by the system. In the present test example, in a micromirror device having a mirror with a diameter of 1.1 mm, various R2s were set and consumed power and the like were evaluated. Since a micromirror device having a mirror having a diameter of about 1.0 mm is often used for a driving module using a small battery such as a wearable terminal, the battery capacity is small and low consumed power is required. For example, in a case of performing a two-dimensional scanning with a micromirror device using a small lithium-ion battery with a capacity of about 150 mAh, the total consumed power may be 20 mW or less. In this case, the driving can be performed for about 24 hours or more with one charge. As a result, it is possible to satisfy the minimum charging frequency as a consumer product. The consumed power required for scanning around each of the first axis and second axis may be reduced to 10 mW or less. In this case, the total consumed power may be set to 20 mW or less in a case where these are driven simultaneously to perform a two-dimensional scanning. According to the above test example, it was found that the consumed power for scanning around the second axis can be suppressed to 10 mW or less by designing R2 to be 0.75 or more and 27 or less. Thus, the test example is preferable. Further, by designing R2 to 2.3 or more, the stress applied to the piezoelectric film can be reduced and the durability can be improved.

<First Resonance Mode Characteristic Evaluation: Test Example 5, Test Examples 9 to 19>

Test Example 5 and Test Examples 9 to 19 were designed so that the shape of the mirror portion 12 was a circle with a diameter of 1.1 mm, the dimensions of the second actuator 16 were W2_y=0.6 mm and W2_x=0.45 mm, and the resonance frequency of the second resonance mode was about 10 kHz. In each case, the resonance frequency of the first resonance mode was designed to be about 60 kHz. As described above, Test Example 5 is the micromirror device of Example 1. For the micromirror device of the test example, a sinusoidal voltage signal having a resonance frequency corresponding to the first resonance mode in which the first actuator 14 and the mirror portion 12 tilt and oscillate in opposite phases was applied to the first actuator. Thereby, the mirror portion was tilted and driven around the first axis.

Table 3 shows the dimensions of each test example and the test results.

TABLE 3

|  | td (mm) | W1_x (mm) | W1_y (mm) | X1 (mm) | Y1 (mm) | Wc2_y (mm) | Wc2_x (mm) | R1 | Q value | Driving voltage amplitude (V) | Consumed power (mW) | Driving durability (h) | Element area (mm²) |
|---|---|---|---|---|---|---|---|---|---|---|---|---|---|
| Test example 9 | 0.1 | 0.25 | 0.25 | 2.1 | 3.17 | 0.1 | 4 | 7.5 | 800 | 9.5 | 13 | 2 | 31 |
| Test example 10 | 0.1 | 0.2 | 0.25 | 2.1 | 3.77 | 0.18 | 0.6 | 9.4 | 890 | 7.5 | 9.5 | 55 | 34 |
| Test example 11 | 0.1 | 0.25 | 0.25 | 2.1 | 3.77 | 0.238 | 0.8 | 12 | 1200 | 7 | 8.3 | 180 | 36 |

TABLE 3-continued

| | td (mm) | W1_x (mm) | W1_y (mm) | X1 (mm) | Y1 (mm) | Wc2_y (mm) | Wc2_x (mm) | R1 | Q value | Driving voltage amplitude (V) | Consumed power (mW) | Driving durability (h) | Element area (mm²) |
|---|---|---|---|---|---|---|---|---|---|---|---|---|---|
| Test example 12 | 0.1 | 0.45 | 0.25 | 2.5 | 3.17 | 0.12 | 0.6 | 16 | 1300 | 5.5 | 7 | >1400 | 33 |
| Test example 13 | 0.08 | 0.5 | 0.25 | 2.47 | 2.77 | 0.15 | 0.4 | 18 | 1300 | 5.5 | 7.3 | >1400 | 30 |
| Test example 14 | 0.1 | 0.4 | 0.25 | 2.4 | 3.77 | 0.238 | 0.8 | 23 | 1500 | 5 | 7.2 | >1400 | 37 |
| Test example 15 | 0.1 | 0.5 | 0.25 | 2.47 | 3.57 | 0.188 | 0.65 | 30 | 1800 | 4.5 | 6.1 | >1400 | 36 |
| Test example 5 | 0.1 | 0.6 | 0.25 | 2.67 | 3.77 | 0.238 | 0.8 | 36 | 1900 | 4 | 6 | >1400 | 39 |
| Test example 16 | 0.1 | 0.6 | 0.25 | 2.67 | 3.77 | 0.26 | 1.2 | 51 | 2000 | 4 | 6 | >1400 | 41 |
| Test example 17 | 0.1 | 0.9 | 0.25 | 3.4 | 3.77 | 0.238 | 0.8 | 78 | 2010 | 4.1 | 8.8 | >1400 | 43 |
| Test example 18 | 0.1 | 1 | 0.25 | 3.4 | 3.77 | 0.238 | 0.8 | 87 | 2050 | 4.1 | 9.7 | >1400 | 43 |
| Test example 19 | 0.1 | 1.2 | 0.4 | 3.7 | 4.07 | 0.238 | 0.8 | 130 | 2050 | 4 | 12.3 | >1400 | 47 |

The driving voltage amplitude is a sine wave amplitude value required to achieve an optical scan angle of 450 around the first axis during driving at the resonance frequency of the first resonance mode.

The consumed power is consumed power in a case where a 45' optical scanning (one-dimensional scanning) is performed around the first axis without scanning around the second axis.

The driving durability is the time until the optical scan angle is attenuated to 30' or less by performing continuous driving while maintaining resonance with a sinusoidal voltage signal having the voltage amplitude.

The element area is an area of the xy plane of the micromirror device including the fixed portion.

Figure 30:
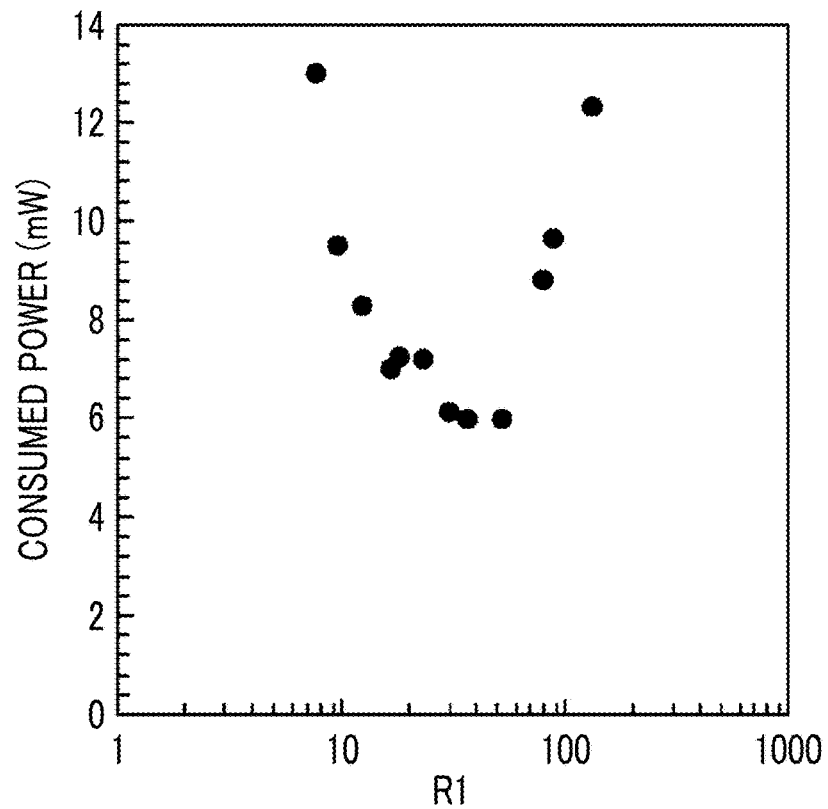
FIG. 30 is a graph showing the relationship between R1 and consumed power.

FIG. 30 is a graph showing the relationship between R1 and consumed power obtained in the test examples shown in Table 3. The amount of consumed power required for a micromirror device depends on the system. Therefore, although not described generally, but the dimensions of the actuator should be designed so that R1 is within the range of 9.4 or more and 87 or less in any application. Thereby, it is possible to achieve a value that is lower than the consumed power required by the system. In the present test example, in a micromirror device having a mirror with a diameter of 1.1 mm, various R1s were set and consumed power and the like were evaluated. Since a micromirror device having a mirror having a diameter of about 1.0 mm is often used for a driving module using a small battery such as a wearable terminal, the battery capacity is small and low consumed power is required. For example, in a case of performing a two-dimensional scanning with a micromirror device using a small lithium-ion battery with a capacity of about 150 mAh, the total consumed power may be 20 mW or less. In this case, the driving can be performed for about 24 hours or more with one charge. As a result, it is possible to satisfy the minimum charging frequency as a consumer product. According to the above test example, it was found that the consumed power for scanning around the first axis can be suppressed to 10 mW or less by designing R1 to be 9.4 or more and 87 or less. Thus, the test example is preferable. Further, by designing R1 to 16 or more, the stress applied to the piezoelectric film can be reduced and the durability can be improved.

Since the purpose of the micromirror device of the test example is to disclose an efficient structure for rotationally driving an object having a certain moment of inertia, the mirror size is unified to 1.1 mm. However, it is apparent that, even in a case where the mirror size is changed, the absolute value of the consumed power changes, but the above-mentioned theory regarding the preferable ranges of R1 and R2 is applicable.

For example, as the diameter of the mirror increases, the moment of inertia increases and the rotation requires more torque. Therefore, in principle, the consumed power increases. For example, in the case of a disk-shaped mirror, a mirror with a diameter of 2.0 mm has a moment of inertia 8 times that of a mirror with a diameter of 1.0 mm. Therefore, 8 times more power is necessary to rotate the mirror at the same speed and the same tilt angle.

However, in this case, the consumed power required by the system tends to be large. By maintaining R1 and R2 within the range specified above, the specifications of consumed power required for each system can be satisfied.

Example 2

Figure 31:
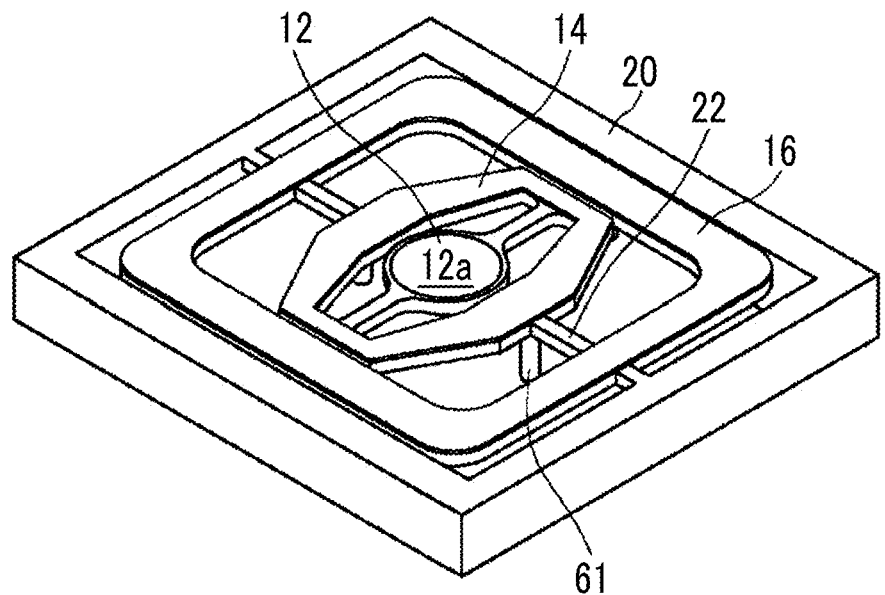
FIG. 31 is a perspective view showing the surface of the micromirror device of Example 2.
Figure 32:
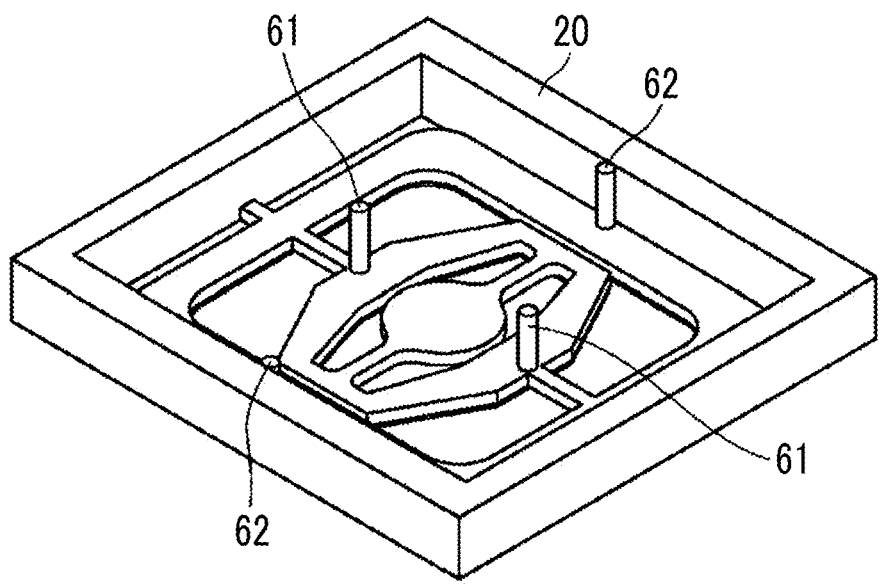
FIG. 32 is a perspective view showing the back surface of the micromirror device of Example 2.
Figure 33:
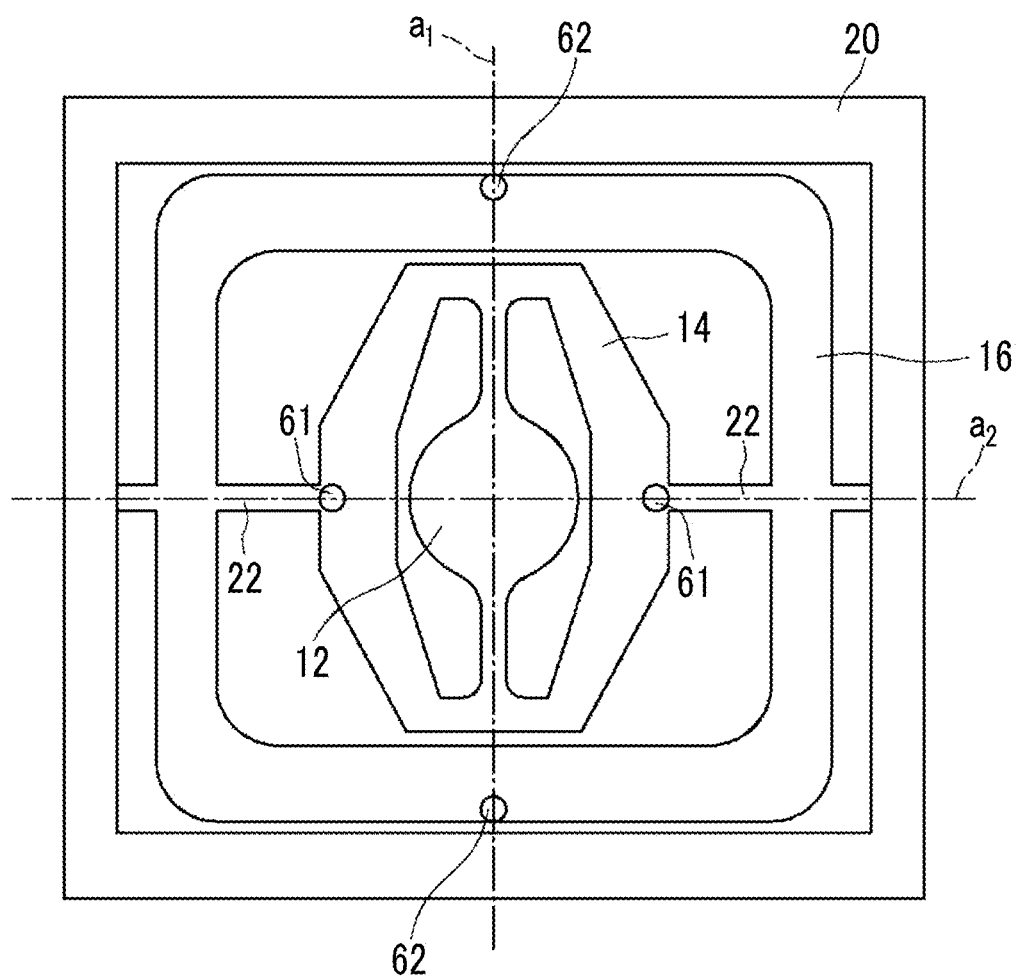
FIG. 33 is a plan view showing the back surface of the micromirror device of Example 2.

As Example 2, in the micromirror device of Example 1, a micromirror device having a stopper on a surface (back surface) opposite to the surface on which the reflective surface is provided is provided. The configuration is the same as that of Example 1 except that the stopper is provided. FIG. 31 is a perspective view of the surface (front surface) of the micromirror device of Example 2 on the reflective surface 12a side, FIG. 32 is a perspective view of the back surface, and FIG. 33 is a plan view seen from the back surface.

In Example 2, a cylindrical shape having a thickness of 0.35 mm (=handle layer thickness) and a diameter of 0.2 mm formed by patterning the handle layer was provided on the back surfaces of the first actuator and the second actuator, and is set as each of stopper portions 61 and 62. As shown in FIGS. 32 and 33, a pair of first stopper portions 61 are provided symmetrically with respect to the center of the mirror on the second axis $a_2$ on the back surface of the first actuator 14, and a pair of second stopper portions 62 are provided symmetrically with respect to the center of the mirror on the first axis $a_1$ on the back surface of the second actuator 16.

<Scanning Test>

50 micromirror devices with stopper portions (Example 2) and without stopper portions (Example 1) were provided, and all the chips were mounted on a ceramic package using the substrate 60 as an adhesive 65 using epoxy resin. At this time, a silicon filler having a diameter of 70 m was used as the epoxy resin. As a result, the mounted chip is spaced about 70 m in the z direction with respect to the ceramic package.

In a case where the driving voltage waveforms of the resonance frequency of the first resonance mode and the resonance frequency of the second resonance mode were input and an optical scanning was performed, 450 scanning around the first axis $a_1$ and 300 scanning around the second axis $a_2$ with and without the stopper portion could be performed.

At this time, in a case where the maximum amount of displacement of the second actuator 16 was measured by the laser Doppler method, the maximum amount of displacement of the second actuator 16 in Example 2 with the stopper portion was 40 m, and the ratio R2 of the amount of displacement tilt was calculated to be R2=6.0. Since the amount of displacement of the second actuator 16 is sufficiently smaller than the height of the filler of 70 μm, the stopper portion 62 does not come into contact with the ceramic package even in a case where an optical scanning of 30° is performed around the second axis $a_2$. Thus, it was found that the displacement was uninhibited. The maximum amount of displacement of the first actuator was 15 μm, and the ratio R1 of the amount of displacement tilt was calculated to be R1=28. Since the amount of displacement of the first actuator 14 is also sufficiently smaller than the height of the filler of 70 μm, the stopper portion 61 does not come into contact with the ceramic package even in a case where an optical scanning of 450 is performed around the first axis $a_1$. Thus, it was found that the displacement was uninhibited.

<Impact Test>

50 chips each with a stopper portion (Example 2) and without a stopper portion (Example 1) were dropped from a height of 2 m in the vertical direction. Among the chips without stopper portions, 10 chips were destroyed. On the other hand, none of the chips provided with the stopper portion were destroyed. The cause of the destruction was the breakage of the silicon structure of either the third connection portion 23 or the second connection portion 22 due to excessive displacement at the time of dropping.

It has been clarified that the destruction due to the impact can be suppressed by providing the stopper portions 61 and 62 as in Example 2.

EXPLANATION OF REFERENCES 1A, 1B, 1C, 1D, 2A, 2B, 2C, 2D: electrode
10: micromirror device
12: mirror portion
12a: reflective surface
14: first actuator
14A, 14B: first movable portion
14Aa: one end of first movable portion 14A
14Ab: other end of first movable portion 14A
14Ba: one end of first movable portion 14B
14Bb: other end of first movable portion 14B
16: second actuator
16A, 16B: second movable portion 16
Aa: one end of second movable portion 16A
16Ab: other end of second movable portion 16A
16Ba: one end of second movable portion 16B
16Bb: other end of second movable portion 16B
20: fixed portion
21: first connection portion
22: second connection portion
23: third connection portion
30: movable portion substrate
31: lower electrode
32: piezoelectric film
33: upper electrode
34: piezoelectric film
34A, 34B, 36A, 36B: piezoelectric element
39: insulation film
41A, 41B, 42A, 42B: electrode pad
45: wiring
48: electrode pad
50: sensor portion
51, 52: sensor electrode
60: substrate
61: first stopper portion
62: second stopper portion
65: adhesive
111: micromirror device of Comparative Example 1
112: micromirror device of Comparative Example 2
114: first actuator (movable frame)
123: third connection portion

What is claimed is:

1. A micromirror device comprising:
   a mirror portion that has a reflective surface reflecting incident light;
   a first actuator that has an annular shape and is disposed around the mirror portion;
   a second actuator that has an annular shape and is disposed around the first actuator;
   a first connection portion that connects the mirror portion and the first actuator on a first axis, which is in a plane including the reflective surface of the mirror portion in a stationary state, and that rotatably supports the mirror portion around the first axis;
   a second connection portion that connects the first actuator and the second actuator on a second axis, which is in a plane including the reflective surface of the mirror portion in a stationary state and is orthogonal to the first axis, and that rotatably supports the first actuator around the second axis;
   a third connection portion that is connected to an outer circumference of the second actuator on the second axis; and
   a fixed portion that is connected to the third connection portion, and supports the second actuator through the third connection portion,
   wherein the first actuator and the second actuator are piezoelectric actuators each including a piezoelectric element,
   the first actuator and the second actuator apply a rotational torque around the first axis to the mirror portion and apply a rotational torque around the second axis to the mirror portion and the first actuator so as to two-dimensionally rotationally drive the mirror portion around the first axis and the second axis,
   only the first actuator and the second actuator are provided between the mirror portion and the fixed portion as annular shaped members surrounding the mirror portion in plan view,
   the first actuator has a single annular shape, and
   the second actuator has a single annular shape.

2. The micromirror device according to claim 1,
wherein the first actuator includes a pair of first movable portions having semi-annular shapes,
the second actuator includes a pair of second movable portions having semi-annular shapes,
the first connection portion connects the mirror portion and one end of each of the pair of first movable portions, and the mirror portion and the other end of each of the pair of first movable portions, on the first axis, and
the second connection portion connects one of the pair of first movable portions and one end of each of the pair of second movable portions, and connects the other of the pair of first movable portions and the other end of each of the pair of second movable portions, on the second axis.

3. The micromirror device according to claim 1,
wherein in a case where the micromirror device is driven in a lowest order mode of resonance modes in which the mirror portion tilts and oscillates around the first axis, and the mirror portion and the first actuator tilt and oscillate in opposite phases to each other,
a ratio $R1=|Zm/Lm|/|Za_{11}/La_{11}|$ of an amount of displacement tilt $|Zm/Lm|$ of the mirror portion and an amount of displacement tilt $|Za_{11}/La_{11}|$ of the first actuator is $9.4<R1<87$.

4. The micromirror device according to claim 2,
wherein in a case where the micromirror device is driven in a lowest order mode of resonance modes in which the mirror portion tilts and oscillates around the first axis, and the mirror portion and the first actuator tilt and oscillate in opposite phases to each other,
a ratio $R1=|Zm/Lm|/|Za_{11}/La_{11}|$ of an amount of displacement tilt $|Zm/Lm|$ of the mirror portion and an amount of displacement tilt $|Za_{11}/La_{11}|$ of the first actuator is $9.4<R1<87$.

5. The micromirror device according to claim 3,
wherein the ratio R1 is $16<R1$.

6. The micromirror device according to claim 4,
wherein the ratio R1 is $16<R1$.

7. The micromirror device according to claim 1,
wherein in a case where the micromirror device is driven in a lowest order mode of resonance modes in which the mirror portion and the first actuator tilt and oscillate around the second axis, and the mirror portion, the first actuator, and the second actuator tilt and oscillate in opposite phases to each other,
a ratio $R2=|Za_{12}/La_{12}|/|Za_{22}/La_{22}|$ of an amount of displacement tilt $|Za_{12}/La_{12}|$ of the first actuator and an amount of displacement tilt $|Za_{22}/La_{22}|$ of the second actuator is $0.75<R2<27$.

8. The micromirror device according to claim 2,
wherein in a case where the micromirror device is driven in a lowest order mode of resonance modes in which the mirror portion and the first actuator tilt and oscillate around the second axis, and the mirror portion, the first actuator, and the second actuator tilt and oscillate in opposite phases to each other,
a ratio $R2=|Za_{12}/La_{12}|/|Za_{22}/La_{22}|$ of an amount of displacement tilt $|Za_{12}/La_{12}|$ of the first actuator and an amount of displacement tilt $|Za_{22}/La_{22}|$ of the second actuator is $0.75<R2<27$.

9. The micromirror device according to claim 3,
wherein in a case where the micromirror device is driven in a lowest order mode of resonance modes in which the mirror portion and the first actuator tilt and oscillate around the second axis, and the mirror portion, the first actuator, and the second actuator tilt and oscillate in opposite phases to each other,
a ratio $R2=|Za_{12}/La_{12}|/|Za_{22}/La_{22}|$ of an amount of displacement tilt $|Za_{12}/La_{12}|$ of the first actuator and an amount of displacement tilt $|Za_{22}/La_{22}|$ of the second actuator is $0.75<R2<27$.

10. The micromirror device according to claim 7,
wherein the ratio R2 is $2.3<R2$.

11. The micromirror device according to claim 1,
wherein the fixed portion has a thickness larger than those of the mirror portion, the first actuator, and the second actuator.

12. The micromirror device according to claim 11,
wherein the first actuator includes a first stopper portion consisting of a structure having the same thickness as the fixed portion.

13. The micromirror device according to claim 11,
wherein the second actuator includes a second stopper portion consisting of a structure having the same thickness as the fixed portion.

14. The micromirror device according to claim 1,
further comprising a driving circuit that inputs driving signals to piezoelectric elements of the first actuator and the second actuator.

15. The micromirror device according to claim 14,
wherein the driving circuit inputs, to the piezoelectric elements, driving signals for driving the micromirror device in a first resonance mode in which the mirror portion tilts and oscillates around the first axis and for driving the micromirror device and the first actuator in a second resonance mode in which the mirror portion and the first actuator tilt and oscillate around the second axis.

16. The micromirror device according to claim 15,
wherein the first resonance mode is a lowest order mode of resonance modes in which the mirror portion and the first actuator tilt and oscillate in opposite phases to each other.

17. The micromirror device according to claim 15,
wherein the second resonance mode is a lowest order mode of resonance modes in which the mirror portion, the first actuator, and the second actuator tilt and oscillate in opposite phases to each other.

18. A method of driving the micromirror device according to claim 1, the method comprising:
exciting a first resonance mode, in which the mirror portion tilts and oscillates around the first axis, by inputting a driving signal waveform with a first frequency to the piezoelectric element of the first actuator; and
exciting a second resonance mode, in which the mirror portion and the first actuator tilt and oscillate around the second axis, by inputting a driving signal waveform with a second frequency to the piezoelectric element of the second actuator.

19. The method of driving the micromirror device according to claim 18,
wherein the first actuator excites, as the first resonance mode, a lowest order mode of the resonance modes in which the mirror portion and the first actuator tilt and oscillate in opposite phases to each other.

20. The method of driving the micromirror device according to claim 18,
wherein the second actuator excites, as the second resonance mode, a lowest order mode of the resonance modes in which the first actuator, the mirror portion, and the second actuator tilt and oscillate in opposite phases to each other.

\* \* \* \* \*